United States Patent
Kim

(10) Patent No.: US 11,217,282 B2
(45) Date of Patent: Jan. 4, 2022

(54) OPERATION METHOD OF SYSTEM-ON-CHIP CONFIGURED TO CONTROL MEMORY DEVICE

(71) Applicant: SAMSUNG ELECTRONICS CO., LTD., Suwon-si (KR)

(72) Inventor: Yongseob Kim, Hwaseong-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 16/986,934

(22) Filed: Aug. 6, 2020

(65) Prior Publication Data
US 2021/0151084 A1    May 20, 2021

(30) Foreign Application Priority Data
Nov. 14, 2019 (KR) .......... 10-2019-0146041

(51) Int. Cl.
| G11C 7/10 | (2006.01) |
| G06K 9/62 | (2006.01) |
| G11C 7/14 | (2006.01) |
| G11C 7/22 | (2006.01) |

(52) U.S. Cl.
CPC .......... *G11C 7/1045* (2013.01); *G06K 9/6256* (2013.01); *G11C 7/14* (2013.01); *G11C 7/222* (2013.01); *G11C 2207/2254* (2013.01)

(58) Field of Classification Search
CPC .............. G11C 8/18; G11C 8/10; G11C 8/06
See application file for complete search history.

(56) References Cited

U.S. PATENT DOCUMENTS

| 6,564,116 | B2 | 5/2003 | Wang et al. |
| 7,472,096 | B2 | 12/2008 | Burges et al. |
| 7,647,467 | B1 | 1/2010 | Hutsell et al. |
| 9,053,772 | B2 | 6/2015 | Lee |
| 9,785,158 | B2 | 10/2017 | Lee et al. |
| 9,792,969 | B1 | 10/2017 | Kim et al. |
| 9,984,740 | B1* | 5/2018 | Hiraishi ............... G11C 7/222 |
| 10,014,039 | B2 | 7/2018 | Lee et al. |
| 10,031,240 | B2 | 7/2018 | Mao et al. |
| 10,108,504 | B2 | 10/2018 | Choi |
| 10,719,058 | B1* | 7/2020 | Johnson ............... G06F 9/4403 |

(Continued)

*Primary Examiner* — Ajay Ojha
(74) *Attorney, Agent, or Firm* — Volentine, Whitt & Francos, PLLC

(57) ABSTRACT

An operation method of a system-on-chip (SoC) that controls a memory device includes transmitting a first mode register write (MRW) command to the memory device through command/address (CA) lines, transmitting a second MRW command including a specific pattern to the memory device through the CA lines, transmitting a first mode register read (MRR) command for reading the specific pattern to the memory device through the CA lines, capturing the specific pattern received through data lines from the memory device based on an SoC reference voltage, adjusting the SoC reference voltage based on the captured specific pattern, transmitting a second MRR command to the memory device through the CA lines, capturing data signals received from the memory device through the data lines based on the adjusted SoC reference voltage, and performing a plurality of training operations on the memory device after adjusting the SoC reference voltage.

20 Claims, 23 Drawing Sheets

(56) References Cited

U.S. PATENT DOCUMENTS

| | | |
|---|---|---|
| 2014/0149618 A1 | 5/2014 | Venkatesan et al. |
| 2015/0092510 A1 | 4/2015 | Yildirim et al. |
| 2019/0079882 A1 | 3/2019 | Kim et al. |
| 2019/0103154 A1* | 4/2019 | Cox .................... G11C 7/1072 |
| 2019/0156872 A1 | 5/2019 | Kim et al. |
| 2020/0202905 A1* | 6/2020 | Hong ................... G11C 29/023 |
| 2020/0272567 A1* | 8/2020 | Gans ................... G11C 7/1015 |

\* cited by examiner

OPERATION METHOD OF SYSTEM-ON-CHIP CONFIGURED TO CONTROL MEMORY DEVICE

CROSS-REFERENCE TO RELATED APPLICATIONS

A claim for priority under 35 U.S.C. § 119 is made to Korean Patent Application No. 10-2019-0146041 filed on Nov. 14, 2019, in the Korean Intellectual Property Office, the entirety of which is hereby incorporated by reference herein.

BACKGROUND

The present disclosure relates to semiconductor devices, and more particularly to operation methods of a system-on-chip configured to control a memory device.

A system-on-chip (hereinafter referred to as a "SoC") is an integrated circuit in which a plurality of components or a plurality of intellectual property (IP) blocks of an electronic system are integrated. The SoC may communicate with a memory device outside the SoC. Nowadays, as operation speeds of the SoC and the memory device increase, the SoC may perform an initialization operation or a training operation on the memory device before communicating with the memory device at a high speed.

SUMMARY

Embodiments of the inventive concepts provide an operation method of a system-on-chip configured to control a memory device having improved reliability, in an initialization operation of the system-on-chip.

Embodiments of the inventive concepts provide an operation method of a system-on-chip (SoC) that controls a memory device, and that includes transmitting a first mode register write (MRW) command to the memory device through command/address lines; transmitting a second MRW command including a specific pattern to the memory device through the command/address lines; transmitting a first mode register read (MRR) command for reading the specific pattern to the memory device through command/address lines; receiving the specific pattern read from the memory device through data lines; capturing the specific pattern received from the memory device based on an SoC reference voltage generated by the SoC; adjusting the SoC reference voltage based on the captured specific pattern; transmitting a second MRR command to the memory device through the command/address lines; receiving data signals corresponding to the second MRR command from the memory device through the data lines; capturing the received data signals based on the adjusted SoC reference voltage, and performing a plurality of training operations on the memory device after the adjusting the SoC reference voltage.

Embodiments of the inventive concepts further provide an operation method of a system-on-chip (SoC) that controls a memory device, and that includes writing an initial setting value in a mode register circuit of the memory device through command/address lines; adjusting an SoC reference voltage, generated by the SoC, based on information received from the memory device through data lines; capturing device information of the memory device received from the memory device through the data lines based on the adjusted SoC reference voltage, and performing a plurality of training operations on the memory device after the adjusting the SoC reference voltage.

Embodiments of the inventive concepts still further provide an operation method of a system-on-chip (SoC) that controls a memory device, and that includes performing a first mode register write operation and a first mode register read operation on a mode register circuit included in the memory device; adjusting an SoC reference voltage, generated by the SoC, based on a result of the first mode register read operation; performing a second mode register read operation on the mode register circuit based on the adjusted SoC reference voltage; and performing a plurality of training operations on the memory device after the adjusting the SoC reference voltage.

Embodiments of the inventive concepts also provides an operation method of a system-on-chip (SoC) that controls a memory device, and that includes transmitting a first mode register write (MRW) command including a first mode register address to the memory device through command/address lines; transmitting a second MRW command including a second mode register address to the memory device through the command/address lines; transmitting a first mode register read (MRR) command including the second mode register address to the memory device through the command/address lines and receiving information corresponding to the second mode register address from the memory device through data lines; transmitting a second MRR command including a third mode register address to the memory device through the command/address lines and receiving device information corresponding to the third mode register address from the memory device through the data lines; and performing a plurality of training operations on the memory device.

Embodiments of the inventive concepts still further provide an operation method of a system-on-chip (SoC) that controls a memory device, and that includes performing a first mode register write operation and a first mode register read operation on a mode register circuit included in the memory device; adjusting an SoC reference voltage, generated by the SoC, to have a first level optimized for mode register read operation at a first speed; performing second mode register read operations using the SoC reference voltage adjusted to have the first level; performing a plurality of training operations on the memory device after the adjusting the SoC reference voltage; and performing third mode read register operations on the memory device using an SoC reference voltage adjusted to have a second level optimized for mode register read operation at a second speed different than the first speed.

BRIEF DESCRIPTION OF THE FIGURES

The above and other objects and features of the inventive concepts will become apparent in view of the following detailed description of exemplary embodiments as taken with reference to the accompanying drawings.

DETAILED DESCRIPTION

Hereinafter, embodiments of the inventive concepts will be described in detail and clearly to such an extent that one of ordinary skill in the art may easily implement the inventive concepts.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
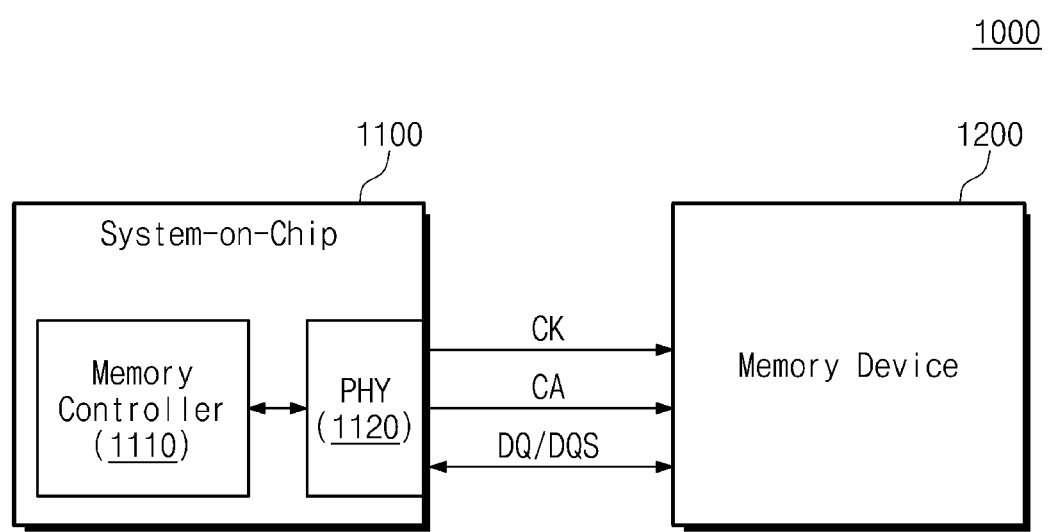
FIG. 1 illustrates a block diagram of an electronic device according to an exemplary embodiment of the inventive concepts.

FIG. 1 illustrates a block diagram of an electronic device according to an exemplary embodiment of the inventive concepts. Referring to FIG. 1, an electronic device 1000 may include system-on-chip 1100 and memory device 1200. In an exemplary embodiment, electronic device 1000 may be one of various computing devices such as for example a desktop computer, a laptop computer, a workstation, a server, a smartphone, a tablet PC, a digital camera, and a black box, or the like.

System-on-chip (SoC) 1100 may control overall operations of electronic device 1000. For example, SoC 1100 may be an application processor (AP) configured to control the overall operations of electronic device 1000. SoC 1100 may run an operating system (OS), a program, or an application that is executable on the electronic device 1000. In an exemplary embodiment, SoC 1100 may include intellectual property cores or blocks (e.g., IP blocks) that control various operations of electronic device 1000 or that control various components included in electronic device 1000.

SoC 1100 may store data in memory device 1200 or may read data stored in memory device 1200. For example, SoC 1100 may include memory controller 1110 and physical layer (PHY) 1120. Memory controller 1110 may be configured to control memory device 1200 through PHY 1120.

Under control of memory controller 1110, PHY 1120 may transmit a clock signal CK and a command/address signal CA to memory device 1200 and may exchange a data signal DQ and a data strobe signal DQS with memory device 1200. In an exemplary embodiment, PHY 1120 may be a DDR-PHY configured to support a DDR interface. That is, PHY 1120 may be configured to support various standard interfaces or protocols, which are defined by the JEDEC standard, such as for example a double data rate (DDR) interface, a graphic DDR (GDDR) interface, and a low-power DDR (LPDDR) interface. However, PHY 1120 of the inventive concepts is not limited to the described standard interfaces or protocols.

Memory device 1200 may operate under control of SoC 1100. For example, memory device 1200 may receive the clock signal CK and the command/address signal CA from SoC 1100. In response to the clock signal CK and the command/address signal CA, memory device 1200 may transmit data to SoC 1100 using/through the data signal DQ and the data strobe signal DQS, or may receive data from SoC 1100 using/through the data signal DQ and the data strobe signal DQS.

In an exemplary embodiment, memory device 1200 may be a dynamic random access memory (DRAM) device, but the inventive concepts are not limited thereto. For example, memory device 1200 may include at least one of various kinds of memory such as DRAM memory, static random access memory (SRAM), resistive random access memory (RRAM), ferroelectric random access memory (FRAM), phase change random access memory (PRAM), magnetic random access memory (MRAM), and flash memory.

In an exemplary embodiment, because SoC 1100 and memory device 1200 have different operation characteristics, initialization or training may be required in an initial operation of electronic device 1000 or an initial operation between SoC 1100 and memory device 1200. In the initialization or training procedure, SoC 1100 may read device information about memory device 1200. In this case, the device information about memory device 1200 may be provided from memory device 1200 to SoC 1100 through the data signal DQ and the data strobe signal DQS. However, in the initial operation, because SoC 1100 captures the data signal DQ by using a reference voltage of a fixed magnitude (i.e., a reference voltage not optimized or a reference voltage not trained), device information provided through the data signal DQ to SoC 1100 may not be normally (i.e., accurately) captured. In this case, the initialization or training may not be normally performed. That is, a booting failure of electronic device 1000 may occur.

In the procedure of initializing memory device 1200, SoC 1100 according to the inventive concepts may decide an optimized reference voltage and may read device information about memory device 1200 by using the optimized reference voltage. Accordingly, in the initialization or training procedure, because SoC 1100 normally (i.e., accurately) reads the device information of memory device 1200, the reliability of the initialization or training procedure may be improved. In an exemplary embodiment, in a next initialization or training procedure, the optimized reference voltage may be reset to an optimized reference voltage used in a normal operation. An operation and a configuration of system-on-chip 1100 according to the inventive concepts will be more fully described hereinafter.

Figure 2:
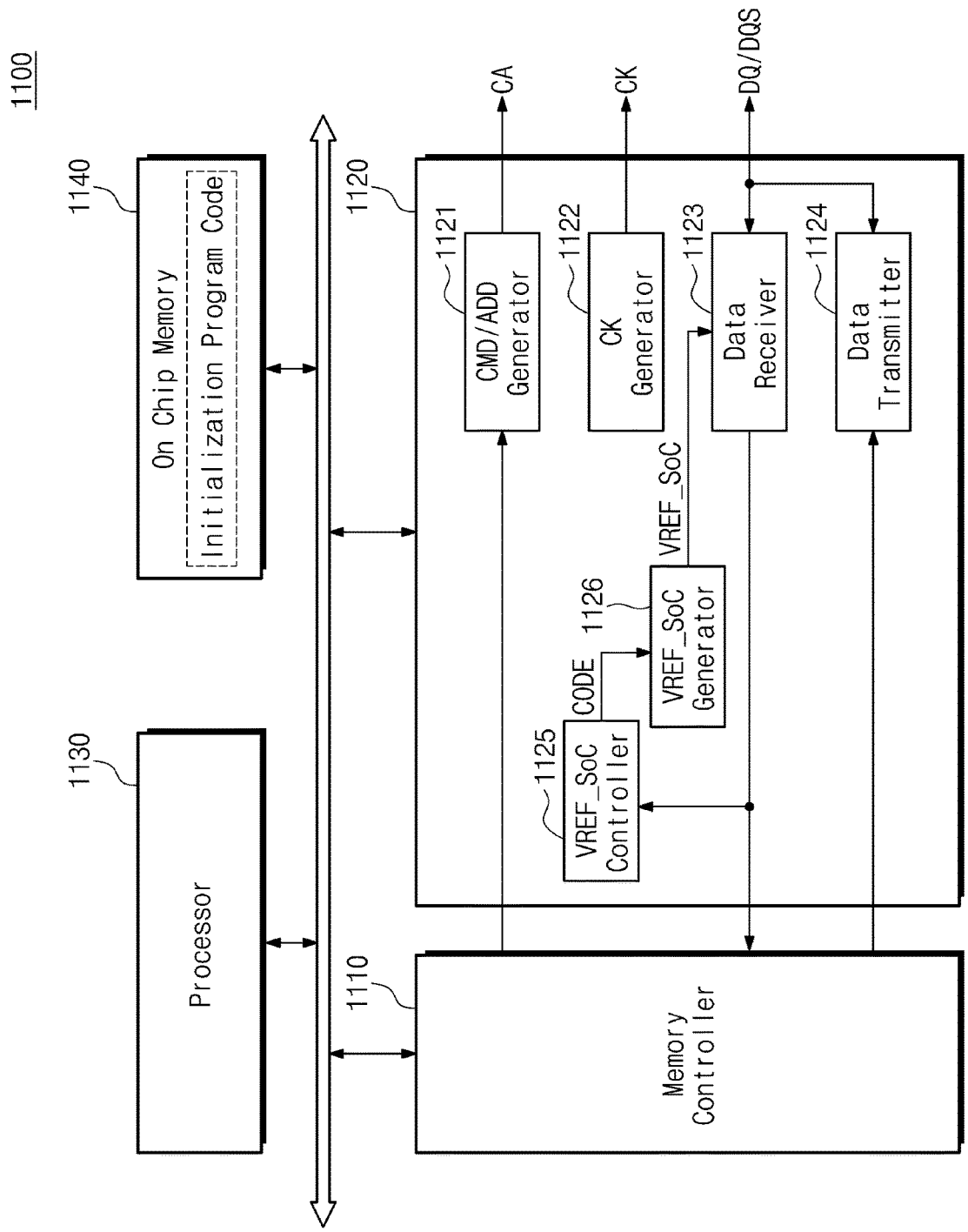
FIG. 2 illustrates a block diagram of an SoC of FIG. 1.

FIG. 2 illustrates a block diagram illustrating an SoC of FIG. 1. Referring to FIGS. 1 and 2, SoC 1100 may include memory controller 1110, PHY 1120, processor 1130, and on-chip memory 1140.

Memory controller 1110 may communicate with memory device 1200 through PHY 1120. Memory controller 1110 may be configured to control memory device 1200 under control of processor 1130. Although not illustrated, memory controller 1110 may include various components for controlling memory device 1200, such as for example a command queue, a command scheduler, and a data queue, among other components.

PHY 1120 may support a physical layer for communication between memory controller 1110 and memory device 1200. PHY 1120 may include command/address (CMD/ADD) generator 1121, clock (CK) generator 1122, data receiver 1123, data transmitter 1124, SoC reference voltage (VREF_SoC) generator 1126, and SoC reference voltage (VREF_SoC) controller 1125.

Command/address generator 1121 may generate the command/address signal CA to be transmitted to memory device 1200 under control of memory controller 1110. The generated command/address signal CA may be provided to memory device 1200 through command and address lines. Clock generator 1122 may generate the clock signal CK to be output to memory device 1200. The generated clock signal CK may be provided to memory device 1200 through a clock line. In an exemplary embodiment, memory device 1200 may operate based on the clock signal CK provided from SoC 1100.

Hereinafter, for the purpose of brevity of illustration and convenience of description, the terms "command/address signal CA", "data signal DQ", and "data strobe signal DQS" may be used and may respectively indicate a command/address line, a data line, and a data strobe line between SoC 1100 and memory device 1200 or may indicate signals transmitted through the corresponding lines.

Data receiver 1123 may receive the data signal DQ and the data strobe signal DQS from memory device 1200. Data receiver 1123 may be configured to capture the data signal DQ at a rising edge or a falling edge of the data strobe signal DQS. In an exemplary embodiment, data receiver 1123 may be configured to capture the data signal DQ based on a SoC reference voltage VREF_SoC and to output reception data. For example, data receiver 1123 may decide the reception data as "1" when a level of the data signal DQ is higher than a level of the SoC reference voltage VREF_SoC at a rising edge or a falling edge of the data strobe signal DQS, and may decide the reception data as "0" when the level of the data signal DQ is lower than the level of the SoC reference voltage VREF_SoC at the rising edge or the falling edge of the data strobe signal DQS. That is, the SoC reference voltage VREF_SoC may be a reference voltage that is used to capture a signal received through/using the data signal DQ and the data strobe signal DQS on an SoC side. The reception data output from data receiver 1123 may be provided to memory controller 1110.

Data transmitter 1124 may output transmission data provided from memory controller 1110 through the data signal DQ and the data strobe signal DQS.

SoC reference voltage generator 1126 may generate the SoC reference voltage VREF_SoC that is used at data receiver 1123. For example, SoC reference voltage generator 1126 may receive a code "CODE" from SoC reference voltage controller 1125 and may generate the SoC reference voltage VREF_SoC corresponding to the received code "CODE".

Processor 1130 may control overall operations of SoC 1100. Processor 1130 may execute various software (e.g., an application program, an operating system, a file system, and a device driver) stored in or loaded onto on-chip memory 1140. Processor 1130 may include homogeneous multi-core processors or heterogeneous multi-core processors. For example, processor 1130 may include at least one of various information processing devices such as central processing units (CPUs), image signal processing units (ISPs), digital signal processing units (DSPs), graphics processing units (GPUs), vision processing units (VPUs), and neural processing units (NPUs).

On-chip memory 1140 may include various components, which are necessary to drive electronic device 1000, such as for example an application program, an operating system, a file system, and a device driver. The various components included in on-chip memory 1140 may be provided in the form of software or firmware and may be driven by processor 1130. In an exemplary embodiment, on-chip memory 1140 may include an initialization program code. The initialization program code may include program instructions for driving the initialization operation of SoC 1100, as described hereinafter. That is, as processor 1130 executes the initialization program code included in on-chip memory 1140, the initialization operation of SoC 1100 according to the inventive concepts to be described hereinafter may be performed. However, the inventive concepts are not limited thereto, and the initialization operation of SoC 1100 according to the inventive concepts may be implemented with/by a separate control circuit or a separate training circuit implemented in the form of hardware.

Figure 3:
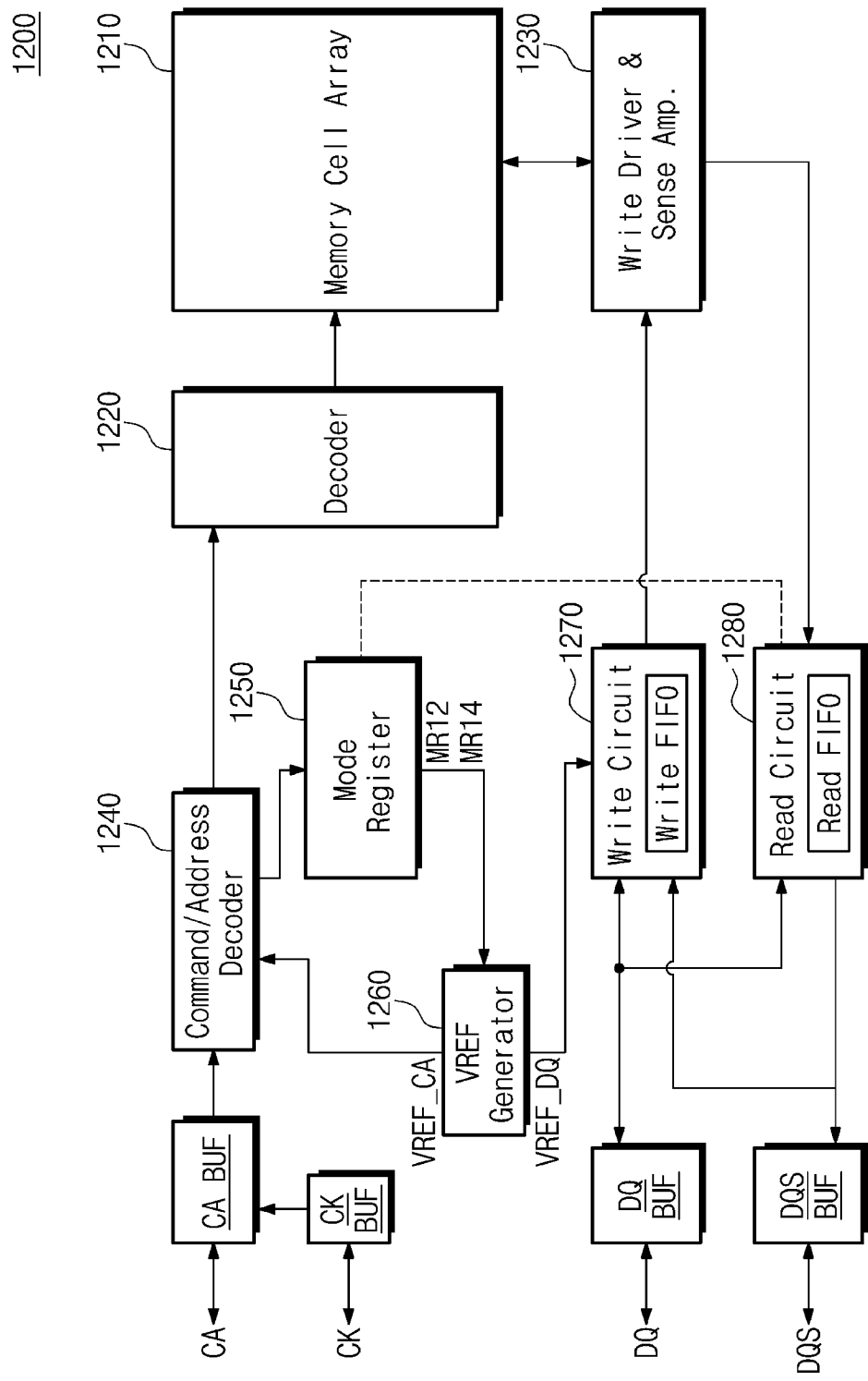
FIG. 3 illustrates a block diagram of a memory device of FIG. 1.

FIG. 3 illustrates a block diagram illustrating a memory device of FIG. 1. Referring to FIGS. 1 and 3, memory device 1200 may include memory cell array 1210, decoder 1220, write driver and sense amplifier 1230, command/address decoder 1240, mode register circuit 1250, write circuit 1270, read circuit 1280, reference voltage (VREF) generator 1260, and buffer circuits CA BUF, CK BUF, DQ BUF, and DQS BUF.

Memory cell array 1210 may include a plurality of memory cells connected with wordlines (not illustrated) and bitlines (not illustrated). Under control of decoder 1220 and write driver and sense amplifier 1230, each of the plurality of memory cells may be configured to store data or to output stored data.

Decoder 1220 may control the plurality of memory cells included in memory cell array 1210. Decoder 1220 may control the plurality of memory cells based on information (e.g., a decoding result) received from command/address decoder 1240.

Write driver and sense amplifier 1230 may be configured to write data in the plurality of memory cells included in memory cell array 1210 or to output data stored in the plurality of memory cells included in memory cell array 1210.

Command/address decoder 1240 may decode a command/address signal CA received through command/address buffer CA BUF. Command/address decoder 1240 may provide the decoding result to decoder 1220 or mode register circuit 1250.

Mode register circuit 1250 may be configured to store or manage various information necessary for memory device 1200 to operate. For example, mode register circuit 1250 may include a plurality of mode registers. Each of the plurality of mode registers may be configured to store given or particular information. In an exemplary embodiment, a mode register corresponding to "MR12" may include information about an internal command/address (CA) reference voltage VREF_CA that is used at memory device 1200, and a mode register corresponding to "MR14" may include information about an internal DQ reference voltage VREF_DQ that is used to capture the data signal DQ at memory device 1200.

Reference voltage generator 1260 may generate reference voltages (e.g., VREF_CA and VREF_DQ) that are used at memory device 1200. For example, reference voltage generator 1260 may generate the internal CA reference voltage VREF_CA based on the "MR12" information of mode register circuit 1250. Command/address decoder 1240 may be configured to capture the command/address signal CA based on the internal CA reference voltage VREF_CA.

Reference voltage generator 1260 may generate the internal DQ reference voltage VREF_DQ based on the "MR14" information of mode register circuit 1250. Write circuit 1270 may be configured to capture the data signal DQ received from SoC 1100 based on the internal DQ reference voltage VREF_DQ.

Write circuit 1270 may receive the data signal DQ and the data strobe signal DQS from SoC 1100 through DQ buffer DQ BUF and DQS buffer DQS BUF. Write circuit 1270 may detect write data by sampling, capturing, or parallelizing the data signal DQ by using the data strobe signal DQS. Write circuit 1270 may store the write data in write first-in first-out (FIFO). Write circuit 1270 may provide the write data stored in the write FIFO to write driver and sense amplifier 1230. In an exemplary embodiment, write circuit 1270 may capture the data signal DQ by using the internal DQ reference voltage VREF_DQ generated from reference voltage generator 1260.

Read circuit 1280 may receive read data from write driver and sense amplifier 1230. Read circuit 1280 may store the received read data in a read FIFO. Read circuit 1280 may output the read data stored in the read FIFO to SoC 1100 through/using DQS buffer DQS BUF and DQ buffer DQ BUF.

In an exemplary embodiment, read circuit 1280 may be configured to receive specific information from mode register circuit 1250 and to output the received information. For example, in the case where a multi-purpose command MPC is received from the SoC 1100, information stored in at least one of the plurality of mode registers included in the mode register circuit 1250 may be stored in the read FIFO of read circuit 1280, and the information stored in the read FIFO may be transmitted to SoC 1100 through DQ buffer DQ BUF and DQS buffer DQS BUF.

Clock buffer CK BUF may receive the clock signal CK from SoC 1100. Memory device 1200 may operate based on the received clock signal CK.

Figure 4A:
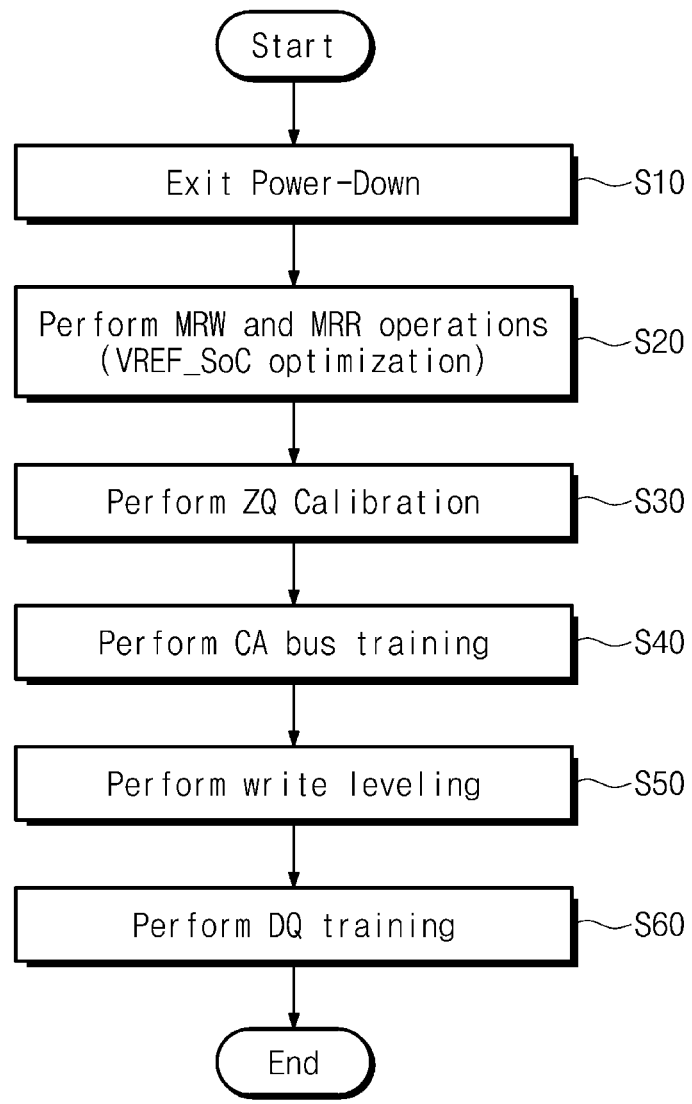
FIG. 4A illustrates a flowchart of an initialization operation of an SoC of FIG. 1.
Figure 4B:
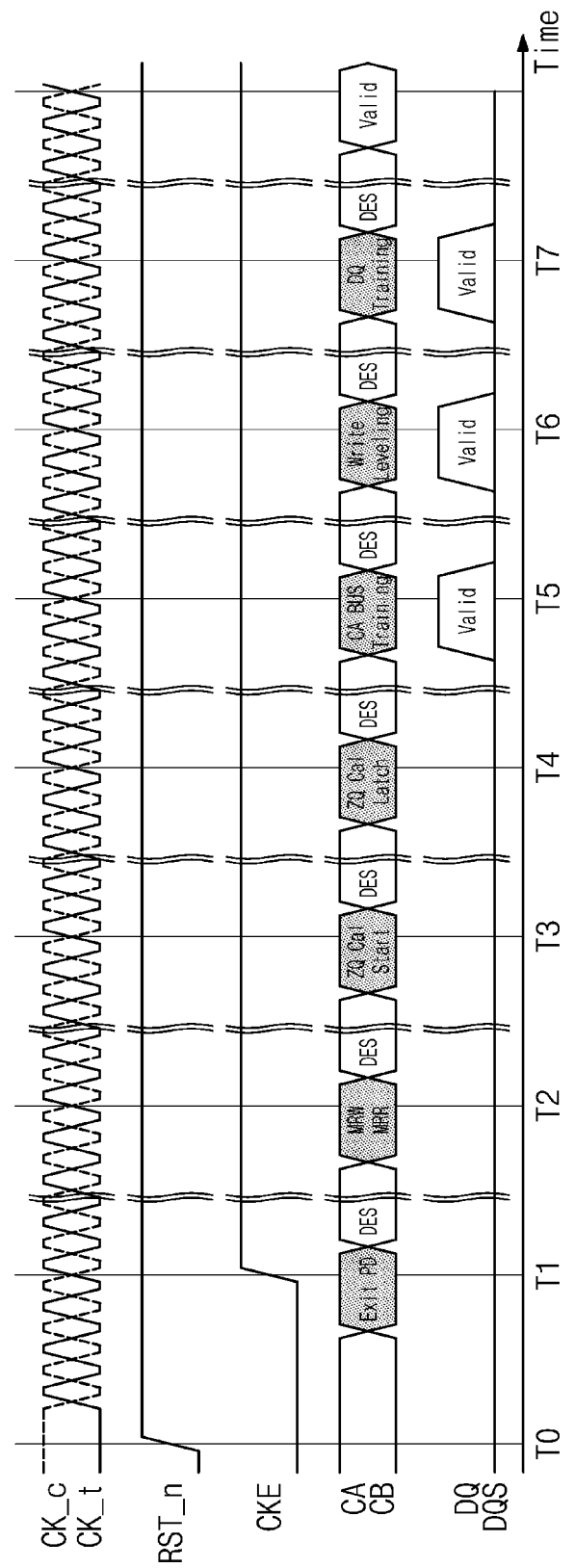
FIG. 4B illustrates a timing diagram of an initialization operation of an SoC of FIG. 1.

FIGS. 4A and 4B respectively illustrate a flowchart and a timing diagram of an initialization operation of an SoC of FIG. 1. For the sake of convenience and brevity, description of components which are unnecessary with respect to the initialization operation of SoC 1100 are omitted from the following. In an exemplary embodiment, the timing diagram of FIG. 4B schematically shows some signals (e.g., CK_c, CK_t (a differential signal of CK_c), RST_n, CKE, CA, DQ, and DQS) that are exchanged between SoC 1100 and memory device 1200. However, the inventive concepts are not limited thereto, and other signals may be exchanged.

Referring to FIGS. 1, 4A, and 4B, in operation S10, SoC 1100 exits a power-down mode (i.e., Exit PD). For example, as illustrated in FIG. 4B, a reset signal RST_n from SoC 1100 rises to logical high at a 0-th time T0. At a first time T1 when a given time elapses from the 0-th time T0, a clock enable signal CKE rises to logical high. At the first time T1, SoC 1100 exits the power-down mode.

In operation S20, SoC 1100 performs mode register write (MRW) and mode register read (MRR) operations. For example, as illustrated in FIG. 4B, at a second time T2 when a given time elapses from the first time T1, SoC 1100 performs the MRW and MRR operations. In an exemplary embodiment, the MRW operation may be an operation that is performed by/for SoC 1100 to write an initial setting value in mode register circuit 1250 of memory device 1200. The MRR operation may be an operation that is performed by/for SoC 1100 to read device information of memory device 1200 stored in mode register circuit 1250 of memory device 1200. That is, by performing the MRW and MRR operations, SoC 1100 may perform initial setting on memory device 1200 and may check the device information of memory device 1200. In an exemplary embodiment, a time interval from the first time T1 to the second time T2 may be a time (e.g., tINIT5) in advance defined by the interface protocol between SoC 1100 and memory device 1200. That is, an MRW command or an MRR command may be transmitted after a given time (e.g., tINIT5) elapses from a time at which the clock enable signal CKE is set to logical high.

In an exemplary embodiment, in operation S20, SoC 1100 may calibrate or train the SoC reference voltage VREF_SoC, which is used at SoC 1100, through the MRW and MRR operations. In an exemplary embodiment, the calibration or training performed on the SoC reference voltage VREF_SoC in operation S20 may be performed to be appropriate for the MRW operation and the MRR operation. In an exemplary embodiment, the calibration or training performed on the SoC reference voltage VREF_SoC in operation S20 may be distinguished from a DQ training operation later.

In operation S30, SoC 1100 performs ZQ calibration. For example, as illustrated in FIG. 4B, at a third time T3 when a given time elapses from the second time T2, SoC 1100 transmits a ZQ calibration start command ZQ Cal Start for the ZQ calibration operation. At a fourth time T4 when a given time elapses from the third time T3, SoC 1100 transmits a ZQ calibration latch command ZQ Cal Latch for storing a ZQ calibration result. SoC 1100 may control ZQ calibration of memory device 1200 through the ZQ calibration start command ZQ Cal Start and the ZQ calibration latch command ZQ Cal Latch.

In operation S40, SoC 1100 performs command/address bus training. For example, as illustrated in FIG. 4B, at a fifth time T5 when a given time elapses from the fourth time T4, the SoC 1100 performs command/address bus training. The internal CA reference voltage VREF_CA may be calibrated through the command/address bus training, and the command/address signal CA may be aligned to the clock signal CK for high speed. In an exemplary embodiment, before operation S40, SoC 1100 and memory device 1200 may perform low-speed operation. That is, the CA reference voltage VREF_CA used before operation S40 may be set to a default value used in low-speed operation, and the internal CA reference voltage VREF_CA optimized for high-speed operation may be decided through the command/address bus training in operation S40.

In operation S50, SoC 1100 performs a write leveling operation. For example, as illustrated in FIG. 4B, at a sixth time T6 when a given time elapses from the fifth time T5, SoC 1100 performs the write leveling operation. The timing or skew of the data strobe signal DQS may be adjusted through the write leveling operation.

In operation S60, SoC 1100 performs a DQ training operation. For example, as illustrated in FIG. 4B, at a seventh time T7 when a given time elapses from the sixth time T6, SoC 1100 performs the DQ training operation. The internal DQ reference voltage VREF_DQ, the data signal DQ, and the data strobe signal DQS may be calibrated or trained through the DQ training operation so as to be appropriate for high-speed operation.

In an exemplary embodiment, the SoC reference voltage VREF_SoC may be again adjusted through the DQ training in operation S60. For example, the calibration or training performed on the SoC reference voltage VREF_SoC in operation S20 may be pre-DQ training or coarse DQ training for temporarily adjusting the SoC reference voltage VREF_SoC, and the DQ training performed in operation S60 may be main DQ training or fine DQ training. That is, in the embodiments of the inventive concepts, the DQ training may be multi-step DQ training.

The initialization operation or training operation between SoC 1100 and memory device 1200 is briefly described with reference to FIGS. 4A and 4B, but the inventive concepts are not limited thereto. For example, a detailed operation scheme associated with various operations such as a ZQ calibration operation, a command/address bus training operation, a write leveling operation, and a DQ training operation may be easily understood by one skilled in the art or may correspond to various operations supported through various standard interfaces, which are defined by the JEDEC standard, such as for example LPDDR, DDR, and GDDR.

Figure 5A:
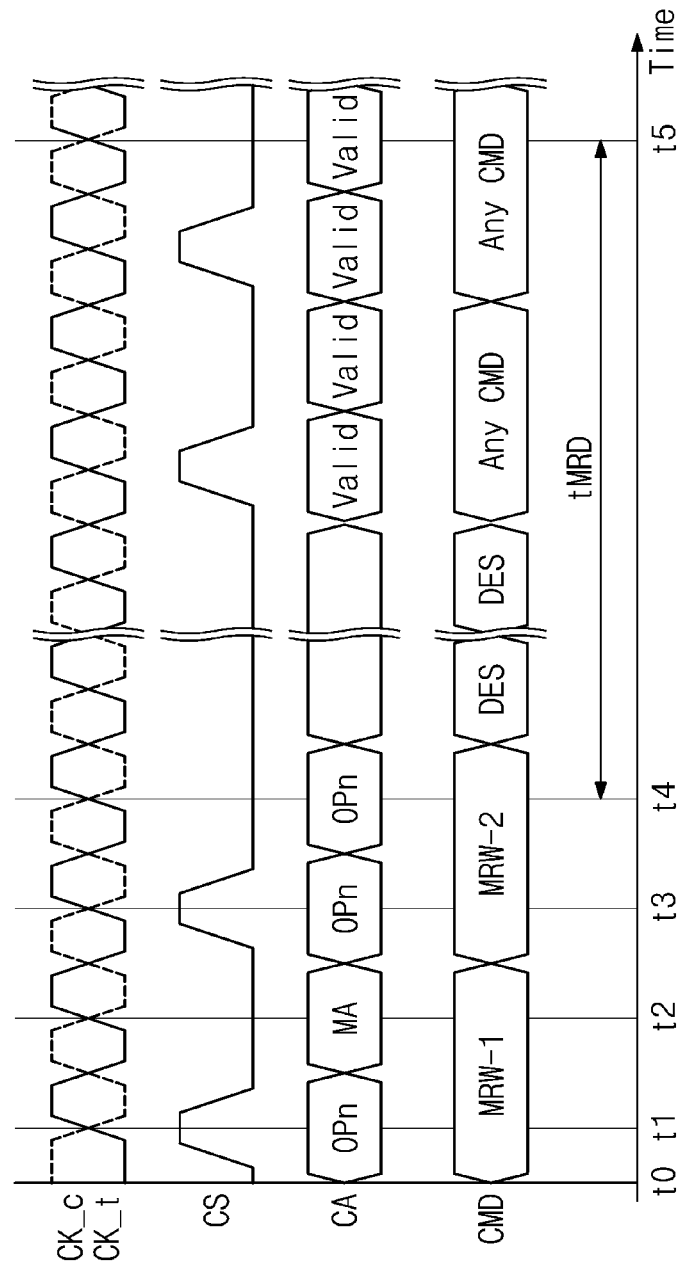
FIG. 5A illustrates a diagram descriptive of details an MRW operation with reference to FIGS. 4A and 4B.
Figure 5B:
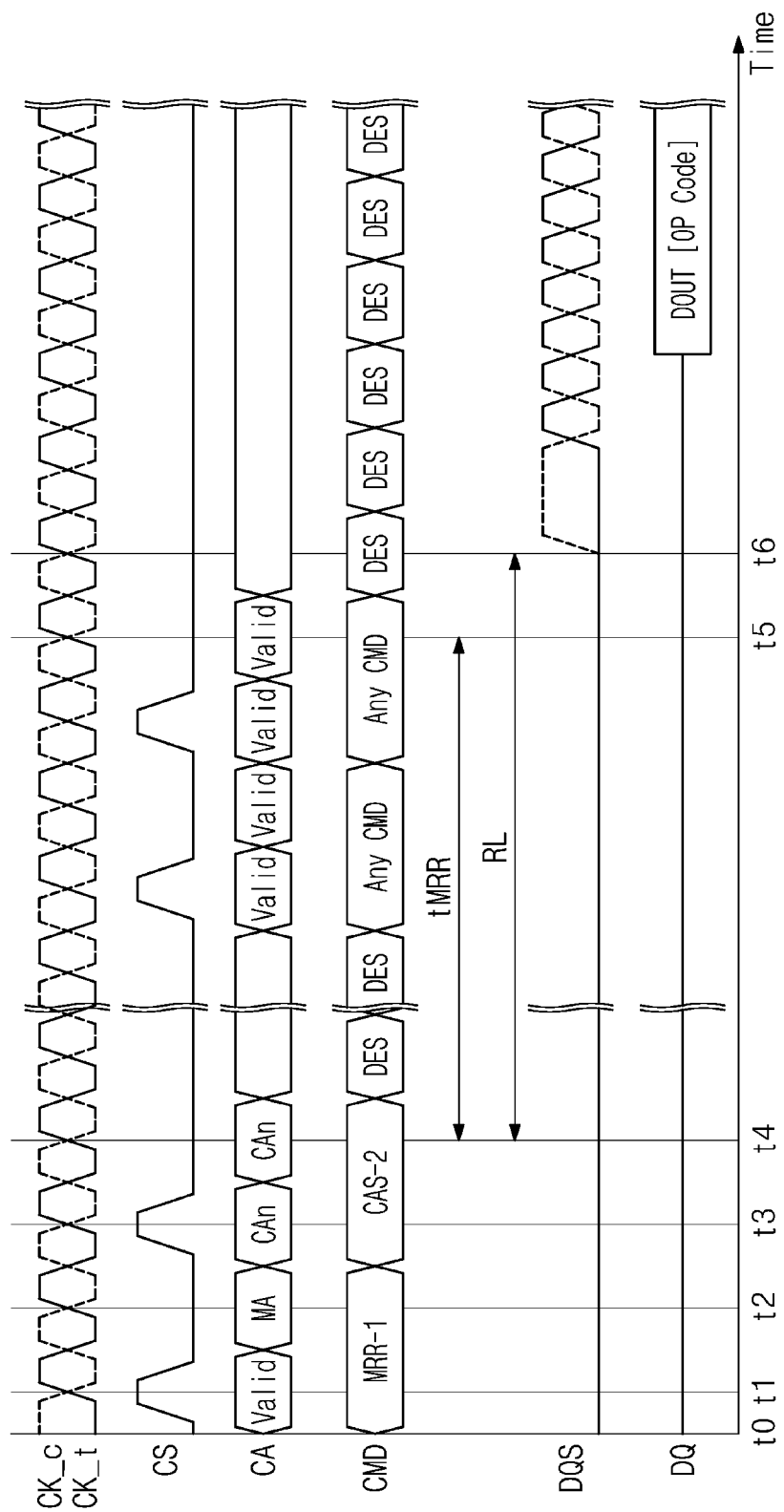
FIG. 5B illustrates a diagram descriptive of details an MRR operation with reference to FIGS. 4A and 4B.
Figure 5C:
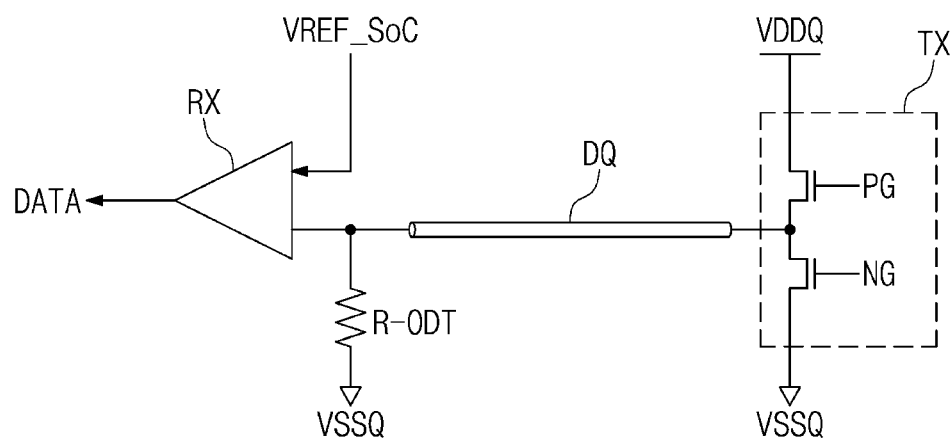
FIG. 5C illustrates a configuration for receiving a data signal DQ.
Figure 5D:
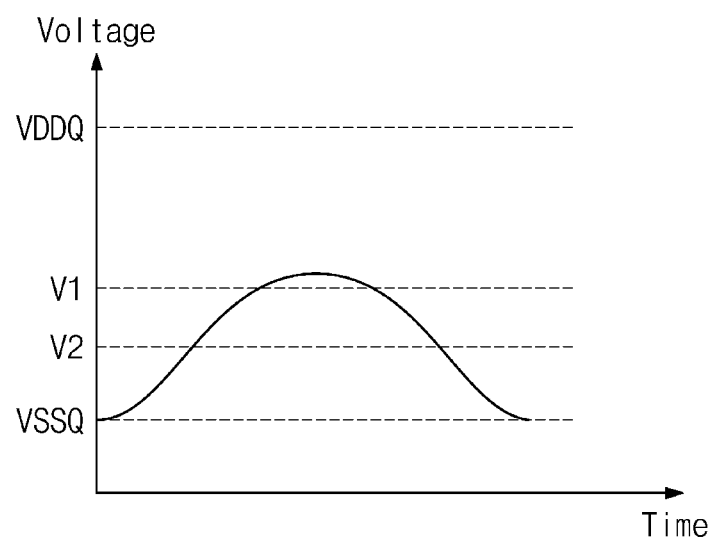
FIG. 5D illustrates a level of a data line through which a data signal DQ is transmitted.

FIGS. 5A, 5B, 5C and 5D illustrate diagrams descriptive of details of MRW and MRR operations with reference to FIGS. 4A and 4B. FIG. 5A illustrate a timing diagram of an MRW operation. FIG. 5B illustrates a timing diagram of an MRR operation. FIG. 5C illustrates a configuration for receiving a data signal DQ. FIG. 5D illustrates a level of a data line through which a data signal DQ is transmitted.

The manner in which SoC 1100 performs the MRW operation will be described with reference to FIGS. 1, 4A, 4B, and 5A. For example, SoC 1100 transmits an operation code OPn through the command/address signal CA at a first time t1 and transmits a mode register address MA through the command/address signal CA at a second time t2. The operation code OPn and the mode register address MA transmitted at the first and second times t1 and t2 may constitute a first MRW command MRW-1. In an exemplary embodiment, the operation code OPn and the mode register address MA included in the first MRW command MRW-1 may be distinguished from each other by setting a chip select signal CS to logical high at the first time t1 and setting the chip select signal CS to logical low at the second time t2.

Immediately after the first MRW command MRW-1 is transmitted, SoC 1100 transmits the operation codes OPn at third and fourth times t3 and t4, respectively. The two operation codes OPn constitute a second MRW command MRW-2. In an exemplary embodiment, the two operation codes OPn included in the second MRW command MRW-2 may be distinguished from each other by setting the chip select signal CS to logical high at the third time t3 and setting the chip select signal CS to logical low at the fourth time t4.

Memory device 1200 may write the received operation codes OPn in a mode register corresponding to the mode register address MA in response to the first and second MRW commands MRW-1 and MRW-2. In an exemplary embodiment, no other operation command may be transmitted from the fourth time t4 when the second MRW command MRW-2 is transmitted to a fifth time t5 when a given time tMRD elapses from the fourth time t4. In other words, only a deselect command DES may be allowed to be transmitted during the tMRD time. In an exemplary embodiment, Table 1 below shows an exemplary command truth table of the first and second MRW commands MRW-1 and MRW-2, based on a protocol of the LPDDR 4.0 specification.

TABLE 1

|  | CS | CA0 | CA1 | CA2 | CA3 | CA4 | CA5 | CK_t |
|---|---|---|---|---|---|---|---|---|
| MRW-1 | H | L | H | H | L | L | OP7 | R1 |
|  | L | MA0 | MA1 | MA2 | MA3 | MA4 | MA5 | R2 |
| MRW-2 | H | L | H | H | L | H | OP6 | R1 |
|  | L | OP0 | OP1 | OP2 | OP3 | OP4 | OP5 | R2 |

As illustrated in Table 1 above, the first and second MRW commands MRW-1 and MRW-2 may be transmitted by controlling the chip select signal CS and a plurality of command/address signals CA. For example, the command/address signal CA may include 0-th to fifth command/address signals CA0 to CA5. SoC 1100 may transmit a first portion (e.g., OPn at the first time t1) of the first MRW command MRW-1 by setting the chip select signal CS and the first and second command/address signals CA1 and CA2 to "H" (high), setting the 0-th, third, and fourth command/address signals CA0, CA3, and CA4 to "L" (low), and setting a seventh operation code OP7 to the fifth command/address signal CA5, at a first rising edge R1 of the clock signal CK_t (e.g., at the first time t1). SoC 1100 may transmit a second portion (e.g., MA at the second time t2) of the first MRW command MRW-1 by setting the chip select signal CS to "L" and setting 0-th to fifth mode register addresses MA0 to MA5 to the 0-th to fifth command/address signals CA0 to CA5, respectively, at a second rising edge R2 of the clock signal CK_t (e.g., at the second time t2). That is, SoC 1100 may transmit the first MRW command MRW-1 by setting the chip select signal CS and the plurality of command/address signals CA0 to CA5 at two rising edges R1 and R2 of the clock signal CK_t like Table 1 above. Likewise, SoC 1100 may transmit a first portion (e.g., OPn at the third time t3) of the second MRW command MRW-2 by setting the chip select signal CS and the first, second, and fourth command/address signals CA1, CA2, and CA4 to "H", setting the 0-th and third command/address signals CA0 and CA3 to "L", and setting a sixth operation code OP6 to the fifth command/address signal CA5, at a first rising edge R1 of the clock signal CK_t (e.g., at the first time t3) after the first MRW command MRW-1 is transmitted.

SoC 1100 may transmit a second portion (e.g., OPn at the fourth time t4) of the second MRW command MRW-2 by setting the chip select signal CS to "L" and setting 0-th to fifth operation codes OP1 to OP5 to the 0-th to fifth command/address signals CA0 to CA5, respectively, at a second rising edge R2 of the clock signal CK_t (e.g., at the fourth time t4). That is, SoC 1100 may transmit the second MRW command MRW-2 by setting the chip select signal CS and the plurality of command/address signals CA0 to CA5 at two rising edges R1 and R2 of the clock signal CK_t like Table 1 above.

The manner in which SoC 1100 performs the MRR operation will be described with reference to FIGS. 1, 4A, 4B, and 5B. For example, SoC 1100 transmits valid information Valid through the command/address signal CA at a first time t1 and transmits a mode register address MA through the command/address signal CA at a second time t2. The valid information Valid and the mode register address MA transmitted at the first and second times t1 and t2 may constitute a first MRR command MRR-1. In an exemplary embodiment, the valid information Valid and the mode register address MA included in the first MRR command MRR-1 may be distinguished from each other by setting the chip select signal CS to logical high at the first time t1 and setting the chip select signal CS to logical low at the second time t2.

Immediately after the first MRR command MRR-1 is transmitted, SoC 1100 transmits column addresses CAn at third and fourth times t3 and t4, respectively. The two column addresses CAn may constitute a second CAS command CAS-2.

In an exemplary embodiment, the two column addresses CAn included in the second CAS command CAS-2 may be distinguished from each other by setting the chip select signal CS to logical high at the third time t3 and setting the chip select signal CS to logical low at the fourth time t4.

In response to the first MRR command MRR-1 and the second CAS command CAS-2 thus received, memory device 1200 may output information stored in a mode register corresponding to the mode register address MA through the data signal DQ and the data strobe signal DQS. For example, at a sixth time t6 when a read latency RL elapses from the fourth time t4 when the second CAS command CAS-2 is received, memory device 1200 may output an operation code OP Code through/using the data signal DQ and the data strobe signal DQS. In this case, the operation code OP Code may be information stored in the mode register corresponding to the mode register address MA of the first MRR command MRR-1. In an exemplary embodiment, no other operation command may be transmitted from the fourth time t4 when the second CAS command CAS-2 is transmitted to a fifth time t5 when a given time tMRR elapses from the fourth time t4. In other words, only a deselect command DES may be allowed or transmitted during the tMRR time. In an exemplary embodiment, Table 2 below shows an exemplary command truth table of the first MRR command and the second CAS command CAS-2, based on a protocol of the LPDDR 4.0 specification.

TABLE 2

|  | CS | CA0 | CA1 | CA2 | CA3 | CA4 | CA5 | CK_t |
|---|---|---|---|---|---|---|---|---|
| MRR-1 | H | L | H | H | H | L | V | R1 |
|  | L | MA0 | MA1 | MA2 | MA3 | MA4 | MA5 | R2 |
| CAS-2 | H | L | H | L | L | H | C8 | R1 |
|  | L | C2 | C3 | C4 | C5 | C6 | C7 | R2 |

As illustrated in Table 2 above, the first MRR command MRR-1 and the second CAS command CAS-2 may be transmitted by controlling the chip select signal CS and the plurality of command/address signals CA0 to CA5. For example, the command/address signal CA may include the 0-th to fifth command/address signals CA0 to CA5. SoC 1100 may transmit a first portion (e.g., Valid at the first time t1) of the first MRR command MRR-1 by setting the chip select signal CS and the first to third command/address signals CA1 to CA3 to "H", setting the 0-th and fourth command/address signals CA0 and CA4 to "L", and setting a valid value "V" to the fifth command/address signal CA5, at a first rising edge R1 of the clock signal CK_t (e.g., at the first time t1 of FIG. 5B). SoC 1100 may transmit a second portion (e.g., MA at the second time t2 of FIG. 5B) of the first MRR command MRR-1 by setting the chip select signal CS to "L" and setting 0-th to fifth mode register addresses MA0 to MA5 the 0-th to fifth command/address signals CA0 to CA5, respectively, at a second rising edge R2 of the clock signal CK_t (e.g., at the second time t2 of FIG. 5B). That is, SoC 1100 may transmit the first MRR command MRR-1 by setting the chip select signal CS and the plurality of command/address signals CA0 to CA5 at two rising edges R1 and R2 of the clock signal CK_t like Table 2 above. Likewise, SoC 1100 may transmit a first portion (e.g., CAn at the third time t3 of FIG. 5B) of the second CAS command CAS-2 by setting the chip select signal CS and the first and fourth command/address signals CAL and CA4 to "H", setting the 0-th, second, and third command/address signals CA0, CA2, and CA3 to "L", and setting an eighth column address C8 to the fifth command/address signal CA5, at a first rising edge R1 of the clock signal CK_t (e.g., at the third time t3 of FIG. 5B) after the first MRR command MRR-1 is transmitted. Afterwards, SoC 1100 may transmit a second portion (e.g., CAn at the fourth time t4 of FIG. 5B) of the second CAS command CAS-2 by setting the chip select signal CS to "L" and setting second to seventh column addresses C2 to C7 to the 0-th to fifth command/address signals CA0 to CA5. That is, SoC 1100 may transmit the second CAS command CAS-2 by setting the chip select signal CS and the plurality of command/address signals CA0 to CA5 at two rising edges R1 and R2 of the clock signal CK_t like Table 2 above.

In an exemplary embodiment, the data strobe signal DQS may start to be toggled after the read latency RL elapses from a time (i.e., t4) at which the second CAS command CAS-2 is transmitted. An operation code OP code corresponding to the MRR command may be transmitted through the data signal DQ in synchronization with the data strobe signal DQS as output data DOUT.

As described above, in the initialization procedure, based on the MRW operation and the MRR operation described with reference to FIGS. 5A and 5B, SoC 1100 may write an initial setting value in memory device 1200 or may read device information of memory device 1200.

In this case, information associated with the MRW operation may be provided from SoC 1100 to memory device 1200 through the command/address signal CA. In contrast, information associated with the MRR operation, in particular, information to be read from memory device 1200 may be provided from memory device 1200 to SoC 1100 through/using the data signal DQ and the data strobe signal DQS. SoC 1100 may capture information received through the data signal DQ and the data strobe signal DQS by using the SoC reference voltage VREF_SoC.

For example, referring to FIGS. 1, 5C, and 5D, memory device 1200 may include a transmitter TX. The transmitter TX may control a level of a data line through which the data signal DQ is transmitted, by controlling first and second control signals PG and NG based on data to be transmitted. A receiver RX of SoC 1100 may receive the data signal DQ output by the transmitter TX. The receiver RX may output data "DATA" by comparing the received data signal DQ with the SoC reference voltage VREF_SoC.

In this case, in the case where on-die termination (ODT) of SoC 1100 is enabled, the data signal DQ output from the transmitter TX may swing in a specific level range. For example, as illustrated in FIG. 5C, in the case where an ODT resistor R-ODT is connected between a VSSQ terminal and a data line for receiving the data signal DQ (i.e., in the case where an ODT scheme is a VSSQ-TERM scheme), as illustrated in FIG. 5D, the data signal DQ may not fully swing between VSSQ and VDDQ. That is, the data signal DQ may swing in a range lower than VDDQ. In this case, when an initial setting value of the SoC reference voltage VREF_SoC is a second voltage V2, a low or high state of the data signal DQ may be normally (e.g., accurately) determined. However, when the initial setting value of the SoC reference voltage VREF_SoC is a first voltage V1, a state of the data signal DQ may not be normally (e.g., accurately) determined. In an exemplary embodiment, the SoC reference voltage VREF_SoC may be set to a fixed value in an initial state (e.g., first voltage V1) and may be again set to an optimum SoC reference voltage VREF_SoC (e.g., second voltage V2) through an initialization procedure (in particular, a DQ training procedure).

That is, because the SoC reference voltage VREF_SoC uses a fixed value in the initialization procedure between SoC 1100 and memory device 1200, in the case where the fixed value is not an optimum level like the first voltage V1, SoC 1100 may fail to normally read device information from memory device 1200 in the MRR operation that is performed before the DQ training operation. In other words, SoC 1100 may fail to normally (e.g., accurately) capture information received from memory device 1200 through the data signal DQ before the DQ training operation.

SoC 1100 according to an exemplary embodiment of the inventive concepts may optimize the SoC reference voltage VREF_SoC before the DQ training operation. Alternatively, SoC 1100 according to an exemplary embodiment of the inventive concepts may optimize the SoC reference voltage VREF_SoC before the MRR operation for reading device information from memory device 1200. Accordingly, the reliability of the MRR operation for reading device information from the memory device 1200 may be improved.

A specific ODT scheme (e.g., a VSSQ-TERM scheme) is described with reference to FIG. 5D, but the inventive concepts are not limited thereto. For example, SoC 1100 or memory device 1200 may be implemented in various ODT schemes such as a VSSQ-TERM scheme, a pseudo open drain (POD) scheme, and a center tap termination (CTT) scheme.

Figure 6:
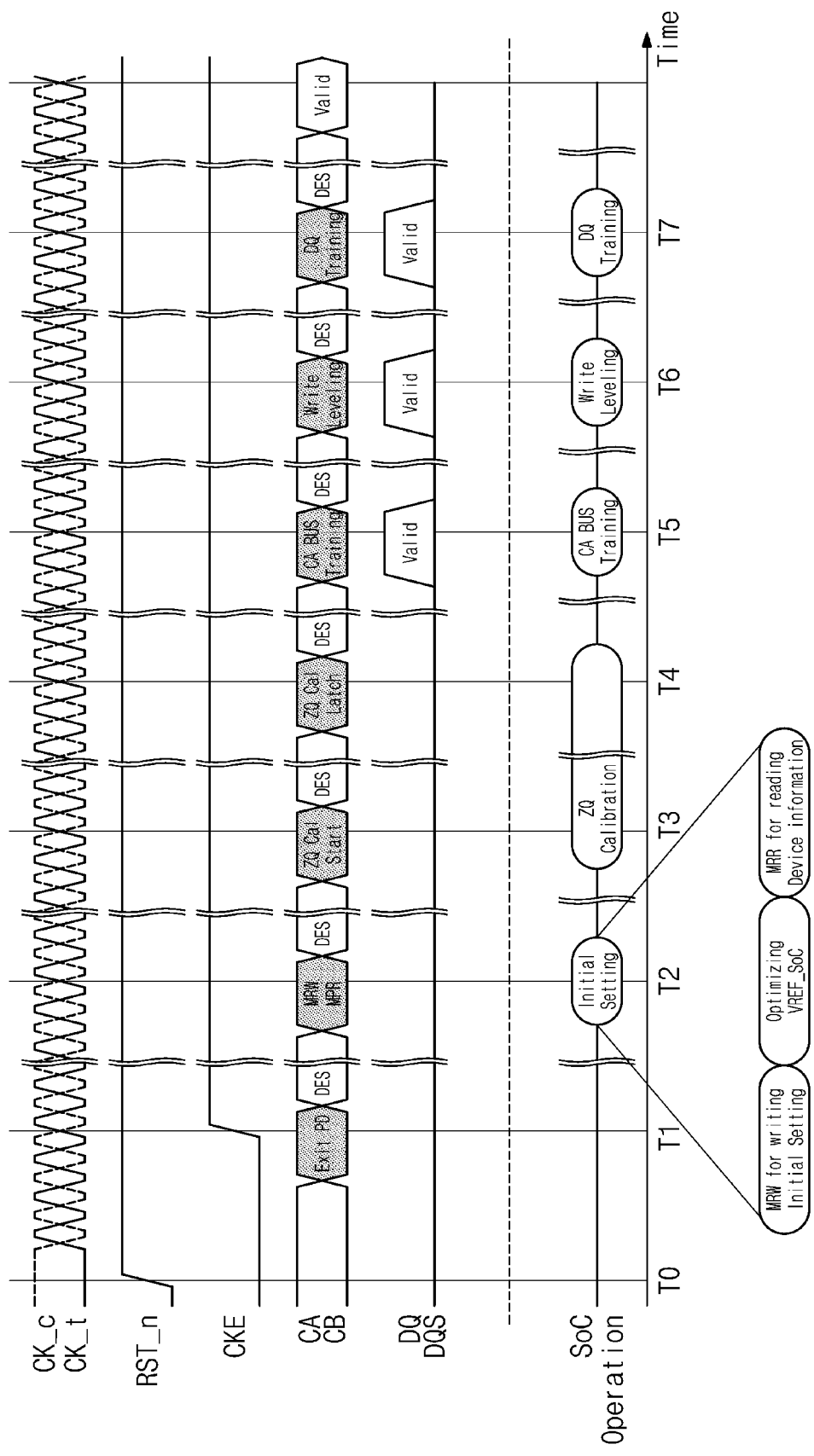
FIG. 6 illustrates a timing diagram of an initialization operation of an SoC of FIG. 1.

FIG. 6 illustrates a timing diagram of an initialization operation of an SoC of FIG. 1. For convenience of description, additional description associated with the above operations and components will be omitted to avoid redundancy. Referring to FIGS. 1 and 6, SoC 1100 performs the initialization operation after exiting the power-down mode. For example, the initialization operation may include the MRW/MRR operation, the ZQ calibration operation, the CA bus training operation, the write leveling operation, and the DQ training operation. A general description and an operation timing associated with each of the MRW/MRR operation, the ZQ calibration operation, the CA bus training operation, the write leveling operation, and the DQ training operation is given with reference to FIG. 4B, and thus additional description of these operations will be omitted here to avoid redundancy.

Through the MRW and MRR operations, SoC 1100 according to an exemplary embodiment of the inventive concepts may write an initial setting value in memory device 1200 and may read device information of memory device 1200. In this case, SoC 1100 may optimize the SoC reference voltage VREF_SoC before performing the MRR operation. For example, SoC 1100 may perform the MRW operation for writing the initial setting value in memory device 1200. In an exemplary embodiment, the MRW operation may be performed based on the timing diagram described with reference to FIG. 5A and a command configuration similar to the command truth table described with reference to Table 1.

Afterwards, SoC 1100 may perform the optimization operation for optimizing the SoC reference voltage VREF_SoC. As further shown, after that, the MRR operation for reading device information from memory device 1200 may be performed. In this case, SoC 1100 may be configured to normally (e.g., accurately) capture the data signal DQ received from the memory device 1200 through the MRR operation, by using the optimized SoC reference voltage VREF_SoC.

In an exemplary embodiment, the operation of optimizing the SoC reference voltage VREF_SoC may include a specific MWR operation of writing a specific pattern in memory device 1200 (in particular, mode register 1250); a specific MRR operation of reading the specific pattern written in memory device 1200 (in particular, the mode register 1250); and an operation of comparing the written specific pattern and the read specific pattern and adjusting a SoC reference voltage based on a result of the comparison. An operation of optimizing the SoC reference voltage VREF_SoC will be more fully described hereinafter with reference to drawings.

In an exemplary embodiment, the SoC reference voltage VREF_SoC optimized in the MRW/MRR operation may be for capturing the data signal DQ through the MRR operation. That is, the SoC reference voltage VREF_SoC optimized in the MRW/MRR operation may be used in the MRR operation (i.e., a low-speed operation), and the optimized SoC reference voltage VREF_SoC may be again set to an optimum level, which is used in a normal operation (i.e., a high-speed operation) of SoC 1100 and memory device 1200, through the DQ training operation later.

Figure 7:
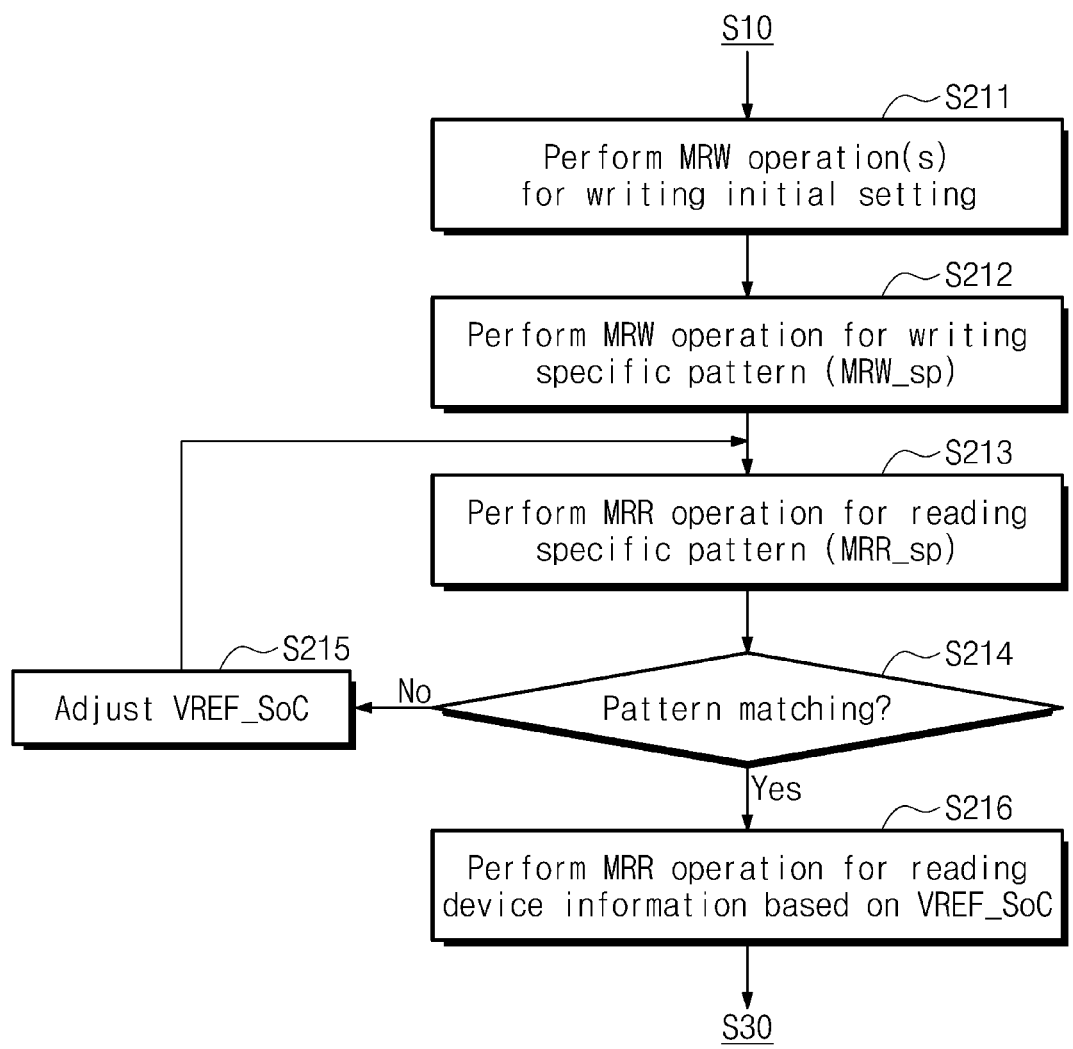
FIG. 7 illustrates a flowchart of an MRW/MRR operation of an SoC according to an exemplary embodiment of the inventive concepts.

FIG. 7 illustrates a flowchart of an MRW/MRR operation of an SoC according to an exemplary embodiment of the inventive concepts. For convenience of description, an operation according to the flowchart of FIG. 7 will be described with reference to the flowchart of FIG. 4A and SoC 1100 of FIG. 1. However, the inventive concepts are not limited thereto. For example, the operation according to the flowchart of FIG. 7 may be an operation of memory device 1200 that is performed under control of SoC 1100 or may be an operation or an interface operation between SoC 1100 and memory device 1200.

Referring to FIGS. 1, 4A, and 7, after operation S10 (i.e., after exiting power-down mode (Exit PD)), SoC 1100 performs operation S211 and operation S216. In operation S211, SoC 1100 performs the MRW operation(s) for writing the initial setting value. For example, SoC 1100 performs the MRW operation for writing the initial setting value in memory device 1200. The MRW operation may be performed based on the timing diagram described with reference to FIG. 5A and a command having a structure similar to the command truth table of Table 1. Through the MRW operation, SoC 1100 may write the initial setting value in the corresponding mode register of the plurality of mode registers included in mode register circuit 1250 of the memory device 1200. In an exemplary embodiment, the initial setting value for memory device 1200 may include information such as FSP-OP/WR, WLS, WL, RL, nWR, DBI-WR/RD, CA ODT, DQ ODT, VREF(CA) Setting, VREF(CA) Value, VREF(DQ) Setting, and VREF(DQ) Value, and the information may be written in the corresponding mode registers through the MRW operations, respectively.

In operation S212, SoC 1100 performs the MRW operation MRW_sp for writing a specific pattern. For example, as described above, SoC 1100 may write the initial setting value in the corresponding mode register through the MRW operation. SoC 1100 may perform the specific MRW operation MRW_sp for writing the specific pattern in a specific mode register, independently of the above MRW operation.

In detail, SoC 1100 may perform the specific MRW operation for writing the specific pattern in a mode register corresponding to "MR14" from among a plurality of mode registers included in the mode register circuit 1250 (see FIG. 3). However, the inventive concepts are not limited thereto. For example, a specific pattern may be written in any one of the plurality of mode registers. Alternatively, the specific pattern may be written in a mode register (e.g., "MR12" or "MR14) supporting both a read function and a write function from among the plurality of mode registers. Alternatively, the specific pattern may be written in a reserved field RFU of a specific mode register of the plurality of mode registers. In an exemplary embodiment, the specific pattern may be a given pattern such as a random pattern, an all-zero pattern, an all-"1" pattern, or a check board pattern (e.g., "1010"). In an exemplary embodiment, the specific MRW operation MRW_sp in operation S212 may be performed based on the timing diagram described with reference to FIG. 5A and the command truth table of Table 1. In an exemplary embodiment, the specific pattern may be included in the operation codes OPn of the command truth table of Table 1.

In operation S213, SoC 1100 perform an MRR operation MRR_sp for reading the specific pattern. For example, SoC 1100 may write the specific pattern in the specific mode register (e.g., "MR14") through operation S212. Afterwards, SoC 1100 may read the specific pattern stored in the specific mode register (e.g., "MR14") through the specific MRR operation MRR_sp. The specific MRR operation MRR_sp may be performed based on the timing diagram described with reference to FIG. 5B and the command truth table of Table 2.

In operation S214, SoC 1100 determines whether the specific pattern read in operation S213 is matched with the specific pattern written in operation S212. For example, as described above, the specific pattern read through the specific MRR operation may be input to SoC 1100 through the data signal DQ. SoC 1100 may capture the data signal DQ by using the SoC reference voltage VREF_SoC. In this case, as described with reference to FIGS. 5C and 5D, in the case where the SoC reference voltage VREF_SoC is not optimized, the specific pattern captured through the SoC reference voltage VREF_SoC may not be matched with an intended specific pattern. That is, in the case where the SoC reference voltage VREF_SoC is not optimized, a pattern different from the written specific pattern may be captured. When the specific pattern read through the data signal DQ is not matched with the written specific pattern (No in S214), thereafter SoC 1100 adjusts the SoC reference voltage VREF_SoC in operation S215. Afterwards, SoC 1100 may repeatedly perform operation S213 to operation S215.

When the specific pattern read through the data signal DQ is matched with the written specific pattern (Yes in S214), SoC 1100 in operation S216 performs the MRR operation for reading device information by using the SoC reference voltage VREF_SoC. For example, that the specific pattern read through the data signal DQ is matched with the written specific pattern may mean that the data signal DQ is normally (e.g., accurately) captured based on the current SoC reference voltage VREF_SoC. That is, SoC 1100 may optimize the SoC reference voltage VREF_SoC through operation S212 to operation S215. Accordingly, device information may be normally read by performing the MRR operation for reading device information by using the optimized SoC reference voltage VREF_SoC. In an exemplary embodiment, after operation S216, SoC 1100 performs operation S30.

In an exemplary embodiment, operation S211 to operation S216 may be performed at a low speed (e.g., a clock cycle time tCKb in booting) or based on a clock having a low frequency. In an exemplary embodiment, after the CA bus training operation (operation S40 of FIG. 4A), SoC 1100 and memory device 1200 may operate at a normal speed (e.g., a speed of the clock signal CK) or based on a clock having a high frequency.

As described above, in the initialization operation, SoC 1100 according to an exemplary embodiment of the inventive concepts may optimize the SoC reference voltage VREF_SoC by repeatedly performing the specific MRW operation MRW_sp and the specific MRR operation MRR_sp before the MRR operation for reading device information from memory device 1200 is performed. Accordingly, the reliability of the MRR operation may be guaranteed.

FIGS. 8A, 8B, 8C and 8D illustrate diagrams descriptive of an operation according to the flowchart of FIG. 7. For convenience of description, components which are unnecessary with respect to operation according to the flowchart of FIG. 7 are omitted. Referring to FIGS. 1, 7, and 8A to 8D, electronic device 1000 may include SoC 1100 and memory device 1200. SoC 1100 may include data receiver 1123, SoC reference voltage controller 1125, and SoC reference voltage generator 1126. Memory device 1200 may include mode register circuit 1250.

Figure 8A:
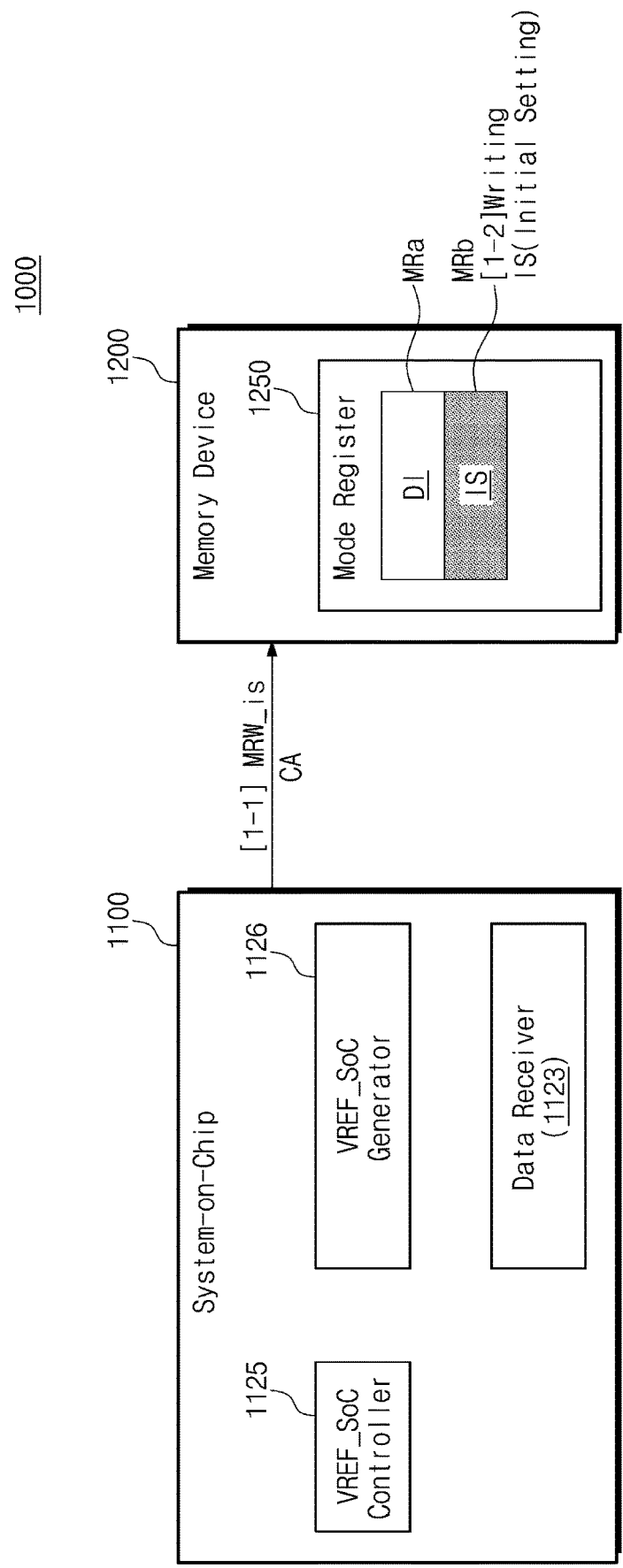
FIGS. 8A, 8B, 8C and 8D illustrate diagrams descriptive of an operation according to the flowchart of FIG. 7.

In operation [1-1] of FIG. 8A, SoC 1100 transmits an initial setting MRW command MRW_is to memory device 1200 through the command/address signal CA. The initial setting MRW command MRW_is may include information about an initial setting value IS. The initial setting MRW command MRW_is may be transmitted based on the timing diagram described with reference to FIG. 5A and the command truth table of Table 1. That is, the initial setting MRW command MRW_is may include the operation codes OPn including the initial setting value IS and the mode register address MA indicating a mode register in which the initial setting value IS is to be stored.

In operation [1-2] of FIG. 8A, memory device 1200 stores the initial setting value IS in mode register circuit 1250 in response to the initial setting MRW command MRW_is. For example, memory device 1200 may store the initial setting value IS in a mode register (e.g., MRb) corresponding to the mode register address MA from among the plurality of mode registers included in mode register circuit 1250. The device information DI may be information stored in another mode register MRa of the plurality of mode registers of mode register circuit 1250.

Figure 8B:
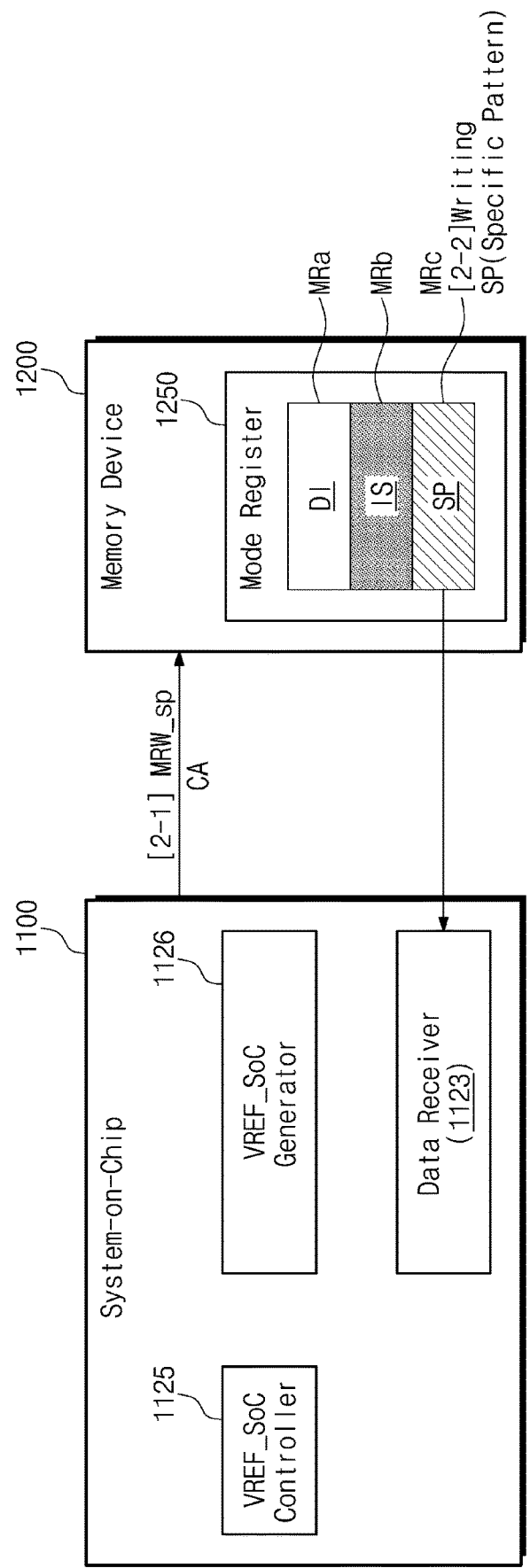

In operation [2-1] of FIG. 8B, SoC 1100 transmits the specific MRW command MRW_sp to memory device 1200 through the command/address signal CA. The operation code OPn of the specific MRW command MRW_sp may include a specific pattern SP. In an exemplary embodiment, the remaining components (e.g., a command timing or levels of other control signals) are similar except that values of the operation code OPn and the mode register address MA of the specific MRW command MRW_sp are different from values of the operation code OPn and the mode register address MA of the initial setting MRW command MRW_is, and thus, additional description will be omitted to avoid redundancy.

In operation [2-2] of FIG. 8B, memory device 1200 writes the specific pattern SP in the corresponding mode register (e.g., MRc) of the plurality of mode registers of mode register circuit 1250 in response to the specific MRW command MRW_sp. In an exemplary embodiment, mode register MRc where the specific pattern SP is written may be one of "MR14" including information about the internal DQ reference voltage VREF_DQ or "MR12" including information about the internal CA reference voltage VREF_CA. Alternatively, the mode register MRc where the specific pattern SP is written may be a mode register supporting both a read function and a write function. Alternatively, the mode register MRc where the specific pattern SP is written may be a reserved field RFU included in the plurality of mode registers. In an exemplary embodiment, Table 3 below shows information stored in a mode register corresponding to "MR14", based on a protocol of the LPDDR 4.0 specification.

TABLE 3

| OP[7] | OP[6] | OP[5] | OP[4] | OP[3] | OP[2] | OP[1] | OP[0] |
|---|---|---|---|---|---|---|---|
| RFU | VR(DQ) | | | VREF(DQ) | | | |

Referring to Table 3 above, OP[7] of the mode register corresponding to "MR14" is a reserved for future use (RFU) field, OP[6] is a field for VR(DQ) (i.e., a range of VREF_DQ), and OP[0] to OP[5] are fields for VREF(DQ) (i.e., the DQ reference voltage VREF_DQ). As understood from Table 3 above, "MR14" may include information about the internal DQ reference voltage VREF_DQ to be used at memory device 1200. That is, while the SoC reference voltage VREF_SoC is optimized, because memory device 1200 does not receive data through the data signal DQ, even though a specific pattern is written in "MR14", an optimization operation may be normally performed. In an exemplary embodiment, after the optimization operation is completed, information about the specific register (e.g., MR14) may be again set to the default settings value. In this case, after the SoC reference voltage VREF_SoC is optimized, the MRW operation for setting a value of a specific mode register to an initial value may be additionally performed.

Figure 8C:
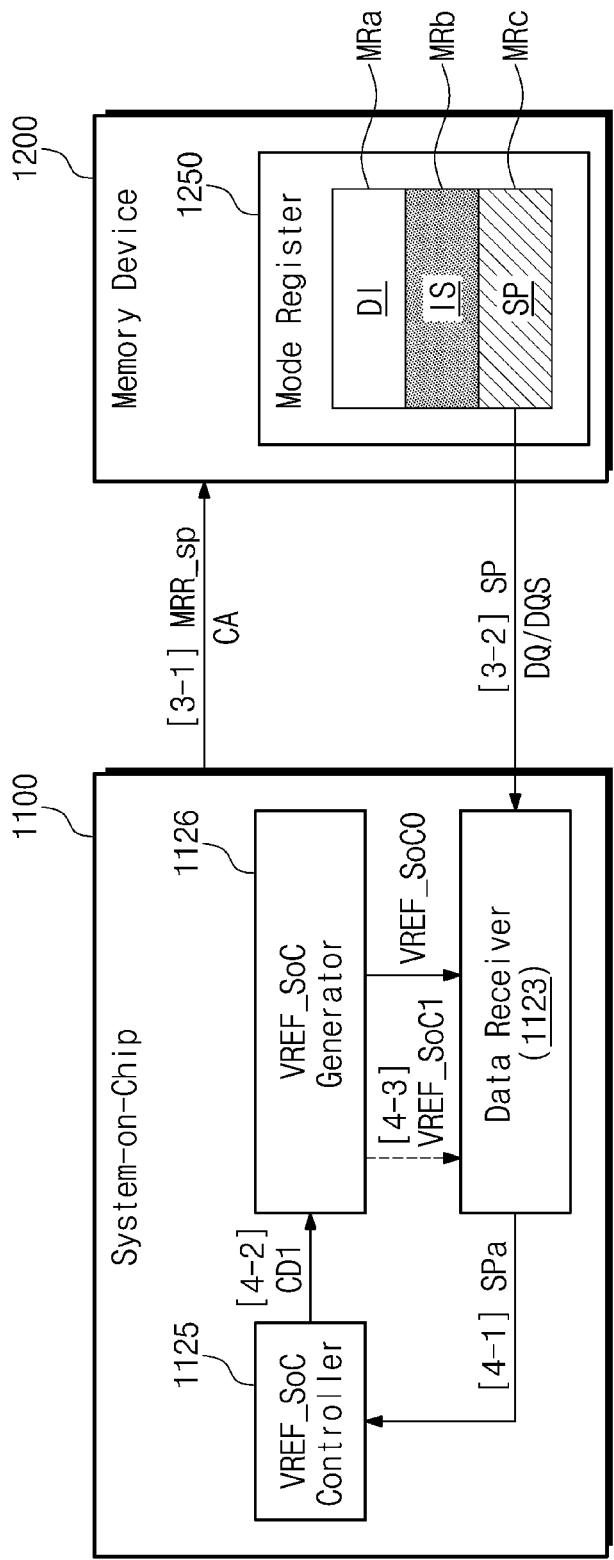

Next, in operation [3-1] of FIG. 8C, SoC 1100 transmits the specific MRR command MRR_sp through the command/address signal CA. In this case, data receiver 1123 of the SoC 1100 may have a 0-th SoC reference voltage VREF_SoC0. In an exemplary embodiment, the 0-th SoC reference voltage VREF_SoC0 may correspond to a fixed value decided in advance by SoC 1100. The specific MRR command MRR_sp may include the mode register address MA corresponding to the mode register (i.e., MRc) where the specific pattern SP is written. The specific MRR command MRR_sp may be performed based on the timing diagram described with reference to FIG. 5B and the command truth table of Table 2.

In operation [3-2] of FIG. 8C, memory controller 1110 outputs the specific pattern SP stored in the specific mode register MRc through/using the data signal DQ and the data strobe signal DQS, in response to the specific MRR command MRR_sp.

In operation [4-1] of FIG. 8C, data receiver 1123 of SoC 1100 captures the specific pattern SP received through the data signal DQ and the data strobe signal DQS based on the 0-th SoC reference voltage VREF_SoC0 and outputs a captured specific pattern SPa.

In the case where the transmitted specific pattern SP and the captured specific pattern Spa are different, in operation [4-2] of FIG. 8C, SoC reference voltage controller 1125 outputs a code CD1 for controlling the SoC reference voltage VREF_SoC. In operation [4-3] of FIG. 8C, SoC reference voltage generator 1126 adjusts the SoC reference voltage VREF_SoC based on the received code CD1. That is, SoC reference voltage generator 1126 may generate a first SoC reference voltage VREF_SoC 1.

Afterwards, SoC 1100 and memory device 1200 may again perform or repeatedly perform operation [3-1], operation [3-2], operation [4-1], operation [4-2], and operation [4-3] illustrated in FIG. 8C. In this case, data receiver 1123 may capture the data signal DQ based on the first SoC reference voltage VREF_SoC1 thus adjusted. That is, as described above, SoC 1100 and memory device 1200 may detect a SoC reference voltage at which the transmitted specific pattern SP and the captured specific pattern Spa are matched, by repeatedly performing the operations of FIG. 8C. The detected SoC reference voltage may have a level optimized to capture the data signal DQ.

Figure 8D:
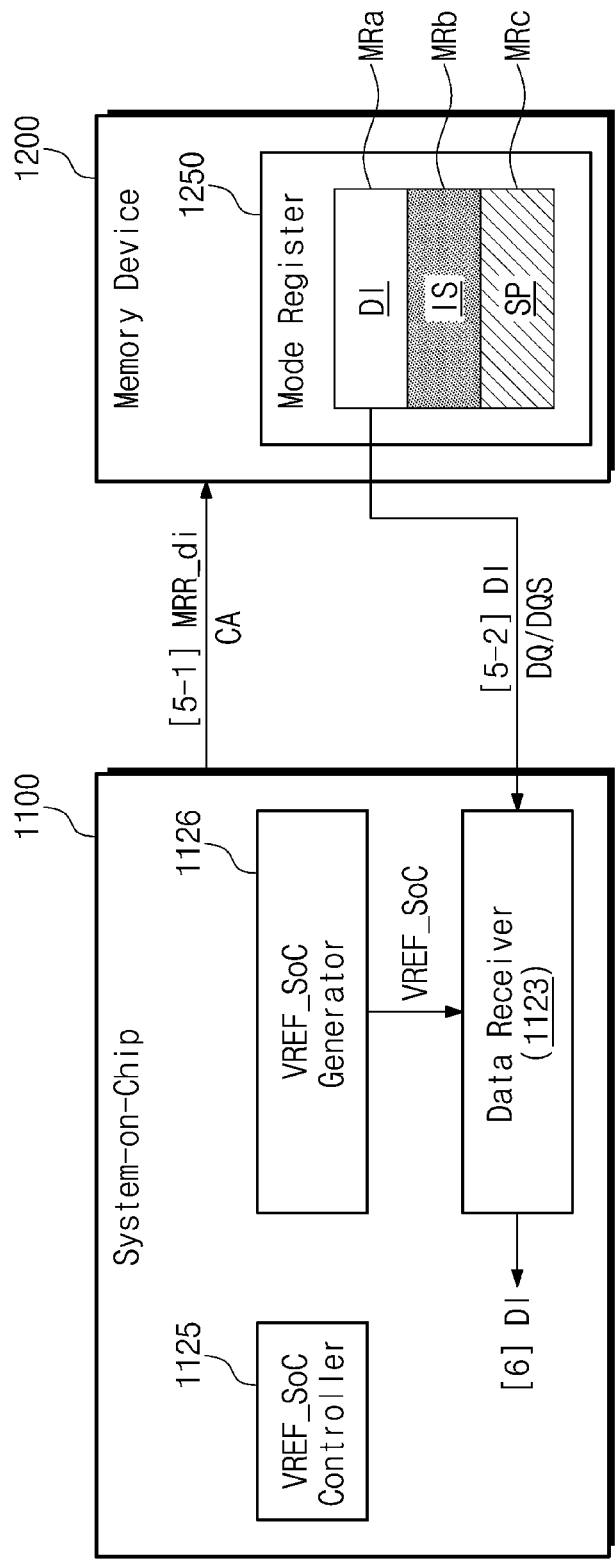

Afterwards, in operation [5-1] of FIG. 8D, SoC 1100 transmits a device information MRR command MRR_di for reading the device information DI to memory device 1200 through the command/address signal CA. The device information MRR command MRR_di may be performed based on the timing diagram described with reference to FIG. 5D and the command truth table of Table 2. The device information MRR command MRR_di may include a mode register address corresponding to a mode register (e.g., MRa), in which the device information DI is stored, from among the plurality of mode registers of mode register circuit 1250. Other components (e.g., command timing and levels of control signals) of the device information MRR command MRR_di are similar to those described with reference to FIG. 5B and Table 2, and thus additional description will be omitted to avoid redundancy.

In operation [5-2] of FIG. 8D, memory device 1200 outputs the device information DI stored in the mode register MRa through/using the data signal DQ and the data strobe signal DQS to SoC 1100, in response to the device information MRR command MRR_di.

In operation [6] of FIG. 8D, data receiver 1123 of SoC 1100 captures the data signal DQ in synchronization with the data strobe signal DQS based on the SoC reference voltage VREF_SoC. In this case, the SoC reference voltage VREF_SoC may have the level optimized by repeatedly performing the operations of FIG. 8C. As such, the device information DI may be normally captured by data receiver 1123.

As described above, in the initialization operation, SoC 1100 according to an exemplary embodiment of the inventive concepts may optimize the SoC reference voltage VREF_SoC for capturing the data signal DQ, by repeatedly performing the specific MRW operation and the specific MRR operation before the MRR operation for reading device information is performed. Accordingly, in a next device MRR operation, because the device information DI provided through the data signal DQ is normally captured, the reliability of the initialization operation or the training operation of SoC 1100 and memory device 1200 may be improved.

An exemplary embodiment is described above as the specific MRW operation is performed only once while the SoC reference voltage VREF_SoC is optimized, but the inventive concepts are not limited thereto. For example, SoC 1100 may repeatedly perform both the specific MRW operation and the specific MRR operation. That is, in the case where a written specific pattern and a read specific pattern are not matched, SoC 1100 may again perform the specific MRW operation and may then perform the specific MRR operation.

Figure 9:
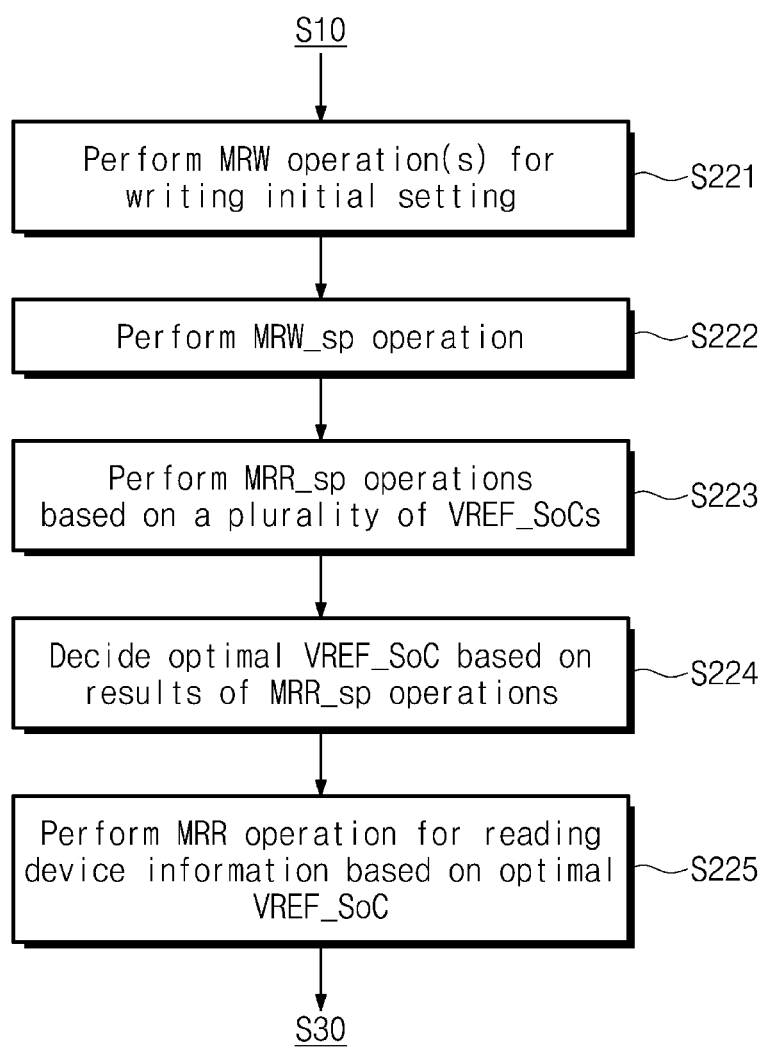
FIG. 9 illustrates a flowchart of an MRW/MRR operation of an SoC according to an exemplary embodiment of the inventive concepts.

FIG. 9 illustrate a flowchart of an MRW/MRR operation of an SoC according to an exemplary embodiment of the inventive concepts. For convenience of description, an operation according to the flowchart of FIG. 9 will be described with reference to the flowchart of FIG. 4A and with reference to SoC 1100. However, the inventive concepts are not limited thereto. For example, the operation according to the flowchart of FIG. 9 may be an operation of memory device 1200 that is performed under control of SoC 1100 or may be an operation or an interface operation between SoC 1100 and memory device 1200.

Referring to FIGS. 1, 4A, and 9, SoC 1100 performs operation S221 to operation S222 after operation S10 (i.e., Exit PD). Operation S221 and operation S222 may be similar to operation S211 and operation S212 of FIG. 7, and thus additional description of operations S221 and S222 will be omitted to avoid redundancy.

In operation S223, SoC 1100 repeatedly performs a plurality of specific MRR operations MRR_sp based on a plurality of SoC reference voltages VREF_SoC. For example, SoC 1100 may perform the specific MRR operations MRR_sp as much as any given number of times, by using different SoC reference voltages VREF_SoC. In an exemplary embodiment, results of the specific MRR operations MRR_sp may be stored in the on-chip memory 1140 (refer to FIG. 2).

In operation S224, SoC 1100 decides an optimum SoC reference voltage VREF_SoC based on results of the specific MRR operations MRR_sp. For example, SoC 1100 may search the results of the specific MRR operations MRR_sp for a result that matches with the written specific pattern SP. SoC 1100 may decide the SoC reference voltage VREF_SoC corresponding to the found result as the optimum SoC reference voltage VREF_SoC.

In an exemplary embodiment, in operation S224, SoC 1100 may perform a scanning operation on the SoC reference voltages VREF_SoC based on the results of the specific MRR operations MRR_sp. For example, SoC 1100 may decide a maximum value and a minimum value, which are associated with an SoC reference voltage, of levels respectively corresponding to results matched with the written specific pattern SP from among the results of the specific MRR operations MRR_sp and may decide an intermediate value of the decided maximum and minimum values as the optimum SoC reference voltage. Alternatively, SoC 1100 may decide the optimum SoC reference voltage based on an average value of levels respectively corresponding to results, which are matched with the written specific pattern SP, from among the results of the specific MRR operations MRR_sp. That is, SoC 1100 may perform a scanning operation for searching for an optimum SoC reference voltage VREF_SoC based on the results of the specific MRR operations MRR_sp in various manners.

Afterwards, SoC 1100 performs operation S225. Operation S225 is similar to operation S215 of FIG. 7, and thus additional description will be omitted to avoid redundancy.

In an exemplary embodiment, SoC 1100 may collect results by repeatedly performing operation S222 and operation S223. For example, SoC 1100 may perform the specific MRW operation and the specific MRR operation based on a first pattern and may then perform the specific MRW operation and the specific MRR operation based on a second pattern different from the first pattern. Alternatively, SoC 1100 may perform the specific MRW operation and the specific MRR operation based on a first mode register and may then perform the specific MRW operation and the specific MRR operation based on a second mode register different from the first mode register. In an exemplary embodiment, whenever the specific MRW operation and the specific MRR operation are repeatedly performed, an SoC reference voltage that is used in the specific MRR operation may be changed. That is, SoC 1100 may perform the specific MRW operation and the specific MRR operation based on various schemes (e.g., a way to use various patterns, various mode registers, etc.) and may decide the optimum SoC reference voltage VREF_SoC based on a result of the operation.

Figure 10:
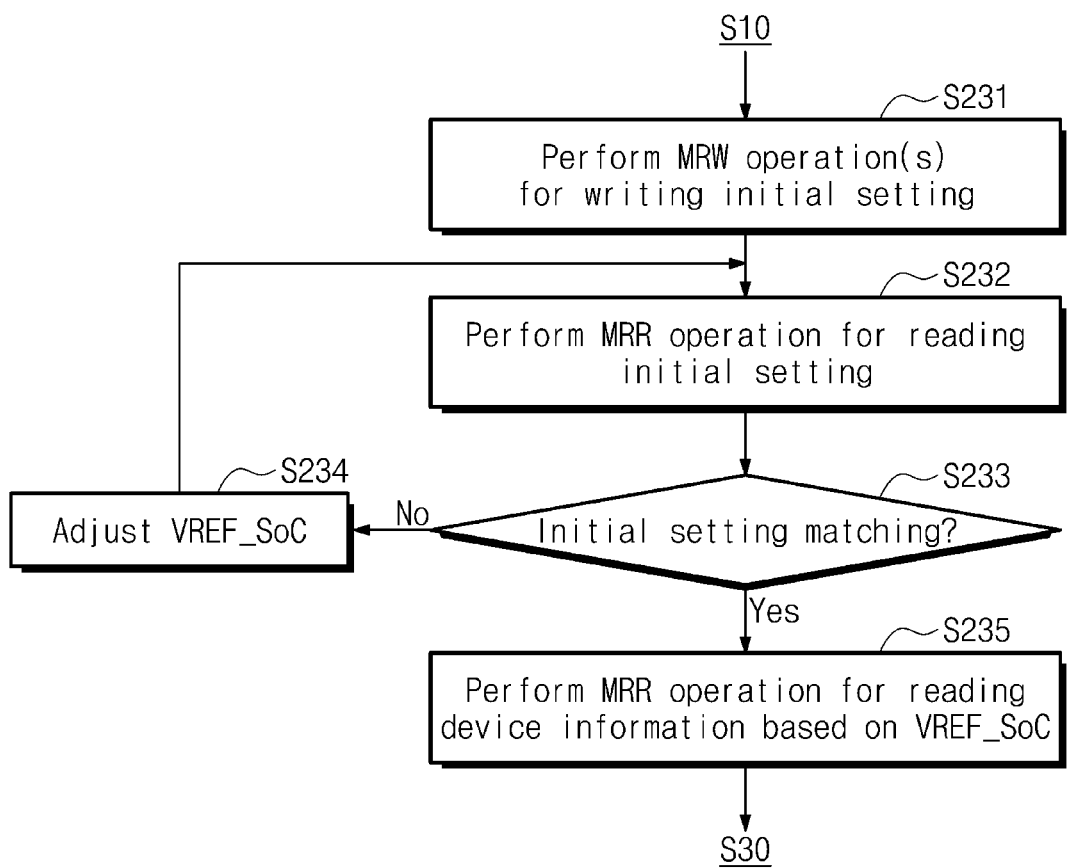
FIG. 10 illustrates a flowchart of an MRW/MRR operation of an SoC according to an exemplary embodiment of the inventive concepts.
Figure 11:
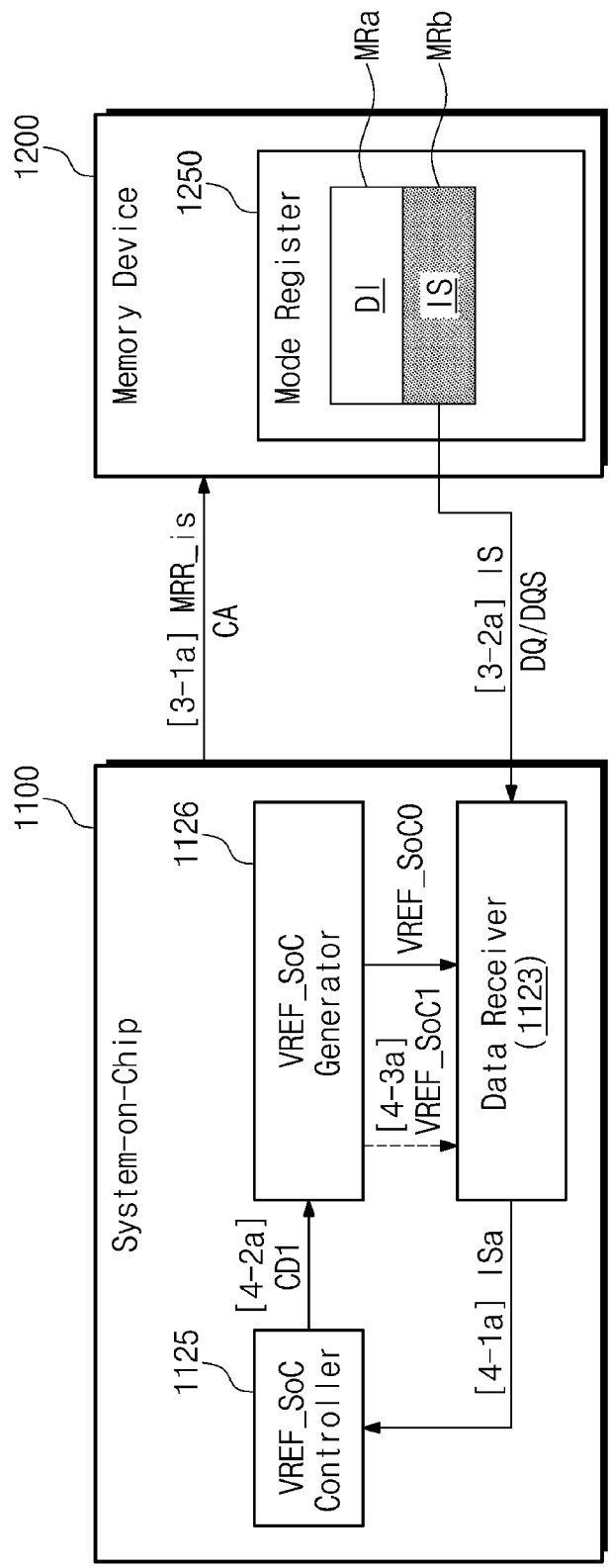
FIG. 11 illustrates a diagram descriptive of an operation according to the flowchart of FIG. 10.

FIG. 10 illustrates a flowchart illustrating an MRW/MRR operation of an SoC according to an exemplary embodiment of the inventive concepts. FIG. 11 illustrates a diagram descriptive of an operation according to the flowchart of FIG. 10. For convenience of description, an operation according to the flowchart of FIG. 10 will be described with reference to the flowchart of FIG. 4A and SoC 1100.

Referring to FIGS. 1, 4A, 10, and 11, SoC 1100 may perform operation S231 after operation S10 (i.e., Exit PD). Operation S231 is similar to operation S211 of FIG. 7, and thus additional description will be omitted to avoid redundancy.

In operation S232, SoC 1100 performs the initial setting MRR operation MRR_is for reading an initial setting value. For example, SoC 1100 may store the initial setting value in mode register circuit 1250 through operation S231. The initial setting value may be decided by SoC 1100 or may be a value decided in advance by the interface protocol between SoC 1100 and memory device 1200. That is, unlike previous embodiments, SoC 1100 may omit the specific MRW operation MRW_sp for writing the specific pattern SP and may perform the initial setting MRR operation MRR_is for reading the initial setting value written through operation S231. Operation S232 (i.e., the initial setting MRR operation) is similar to operation S213 of FIG. 7 except that the initial setting value is read not from the specific register but from another mode register, and thus additional description will be omitted to avoid redundancy.

In operation S233, SoC 1100 determines whether the read initial setting value is matched with the written initial setting value. When the read initial setting value is not matched with the written initial setting value (No in S233), SoC 1100 performs operation S234. When the read initial setting value is matched with the written initial setting value (Yes in S233), SoC 1100 performs operation S235. Operation S234 and operation S235 are respectively similar to operation S215 and operation S216 of FIG. 7, and thus additional description will be omitted to avoid redundancy.

In an exemplary embodiment, as illustrated in FIG. 11, the initial setting value IS may be stored in the specific mode register MRb of the plurality of mode registers of mode register circuit 1250 through the initial setting MRW operation of SoC 1100. In this case, in operation [3-1a] of FIG. 11, SoC 1100 may omit the specific MRW operation (refer to FIG. 8B) and transmits the initial setting MRR command MRR_is for reading the initial setting value IS stored in the specific mode register MRb to memory controller 1110 through the command/address signal CA.

In operation [3-2a] of FIG. 11, memory controller 1110 outputs the initial setting value IS stored in the specific mode register MRb through/using the data signal DQ and the data strobe signal DQS, in response to the initial setting MRR command MRR In operation [4-1a] of FIG. 11, data receiver 1123 of SoC 1100 captures the data signal DQ based on the 0-th SoC reference voltage VREF_SoC0 and outputs a captured initial setting value ISa. In operation [4-2a] of FIG. 11, SoC reference voltage controller 1125 compares the written initial setting value IS and the captured initial setting value ISa and outputs a code CD1 depending on a result of the comparison. In operation [4-3a] of FIG. 11, SoC reference voltage generator 1126 adjusts the SoC reference voltage based on the code CD1 and outputs the first SoC reference voltage VREF_SoC1.

That is, unlike the previous embodiments, as described with reference to FIGS. 10 and 11, SoC 1100 may omit the specific MRW operation and may optimize the SoC reference voltage VREF_SoC by repeatedly performing the initial setting MRR operation for reading an initial setting value.

Figure 12:
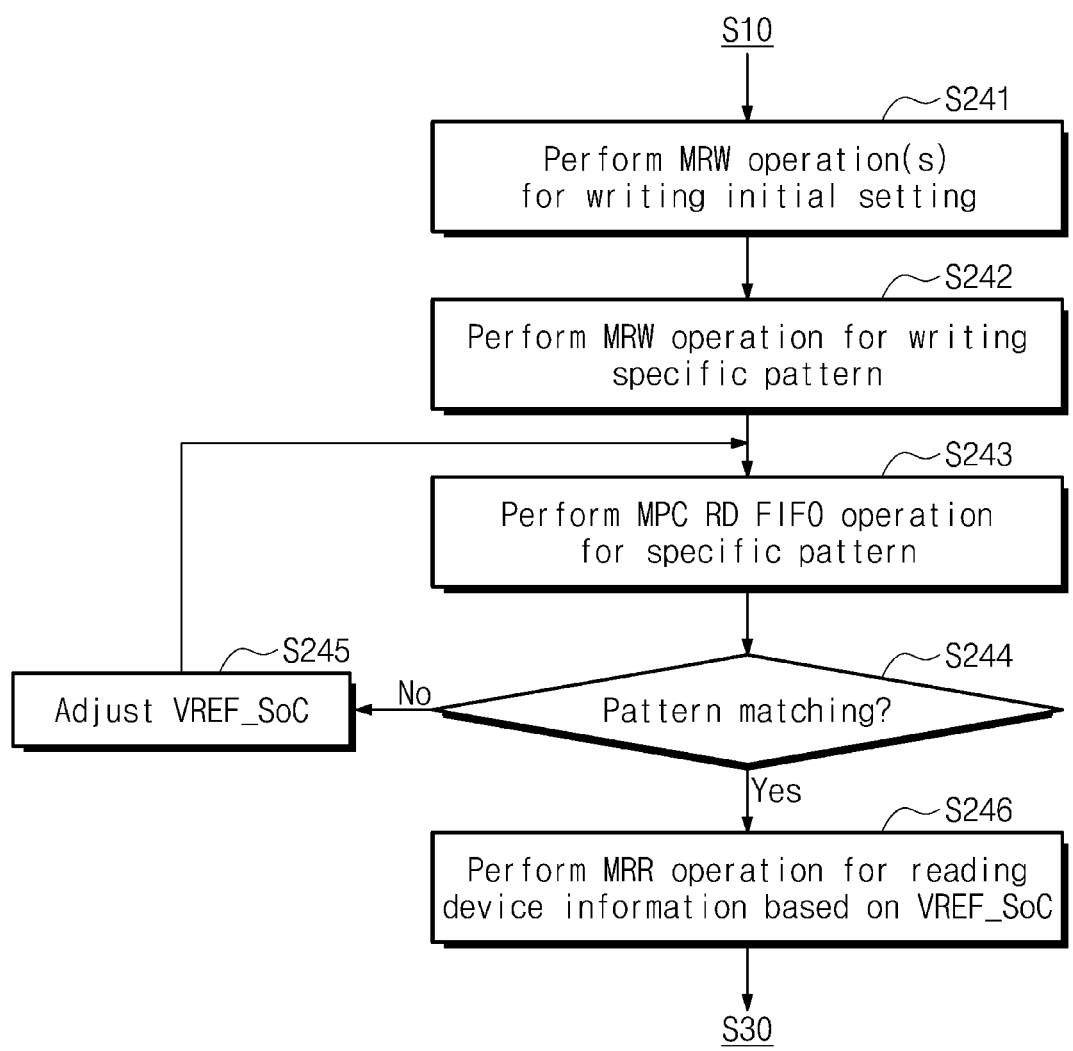
FIG. 12 illustrates a flowchart of an MRW/MRR operation of an SoC according to an exemplary embodiment of the inventive concepts.

FIG. 12 illustrates a flowchart of an MRW/MRR operation of an SoC according to an exemplary embodiment of the inventive concepts. For convenience of description, an operation according to the flowchart of FIG. 12 will be described with reference to the flowchart of FIG. 4A and SoC 1100.

Referring to FIGS. 1, 4A, and 12, SoC 1100 may perform operation S241 after operation S10 (i.e., Exit PD). Operation S241 is similar to operation S211 of FIG. 7, and thus additional description will be omitted to avoid redundancy.

In operation S242, the SoC 1100 performs the specific MRW operation for writing the specific pattern SP. For example, SoC 1100 may perform the specific MRW operation for writing the specific pattern SP in a specific register of the plurality of mode registers of s mode register circuit 1250 in the memory device 1200. In an exemplary embodiment, in the previous embodiments, the mode register where the specific pattern SP is written may be a mode register, which supports both read and write, such as "MR12" or "MR14". In contrast, in the operation according to the flowchart of FIG. 12, the mode register where the specific pattern SP is written may be a mode register (e.g., "MR32" or "MR40") configured to output written information in response to the multi-purpose command MPC.

In operation S243, SoC 1100 performs a read operation that uses the multi-purpose command MPC for reading a specific pattern. For example, SoC 1100 may transmit the multi-purpose command MPC to memory device 1200 through the command/address signal CA. Memory device 1200 may output the specific pattern SP stored in the specific mode register through/using the data signal DQ and the data strobe signal DQS in response to the multi-purpose command MPC.

Afterwards, SoC 1100 perform operation S244, operation S245, and operation S246. Operation S244, operation S245, and operation S246 are respectively similar to operation S214, operation S215, and operation S216 of FIG. 7, and thus additional description will be omitted to avoid redundancy.

As described above, SoC 1100 according to an exemplary embodiment of the inventive concepts may use the MPC command instead of the MRR command for the purpose of optimizing the SoC reference voltage VREF_SoC.

Figure 13A:
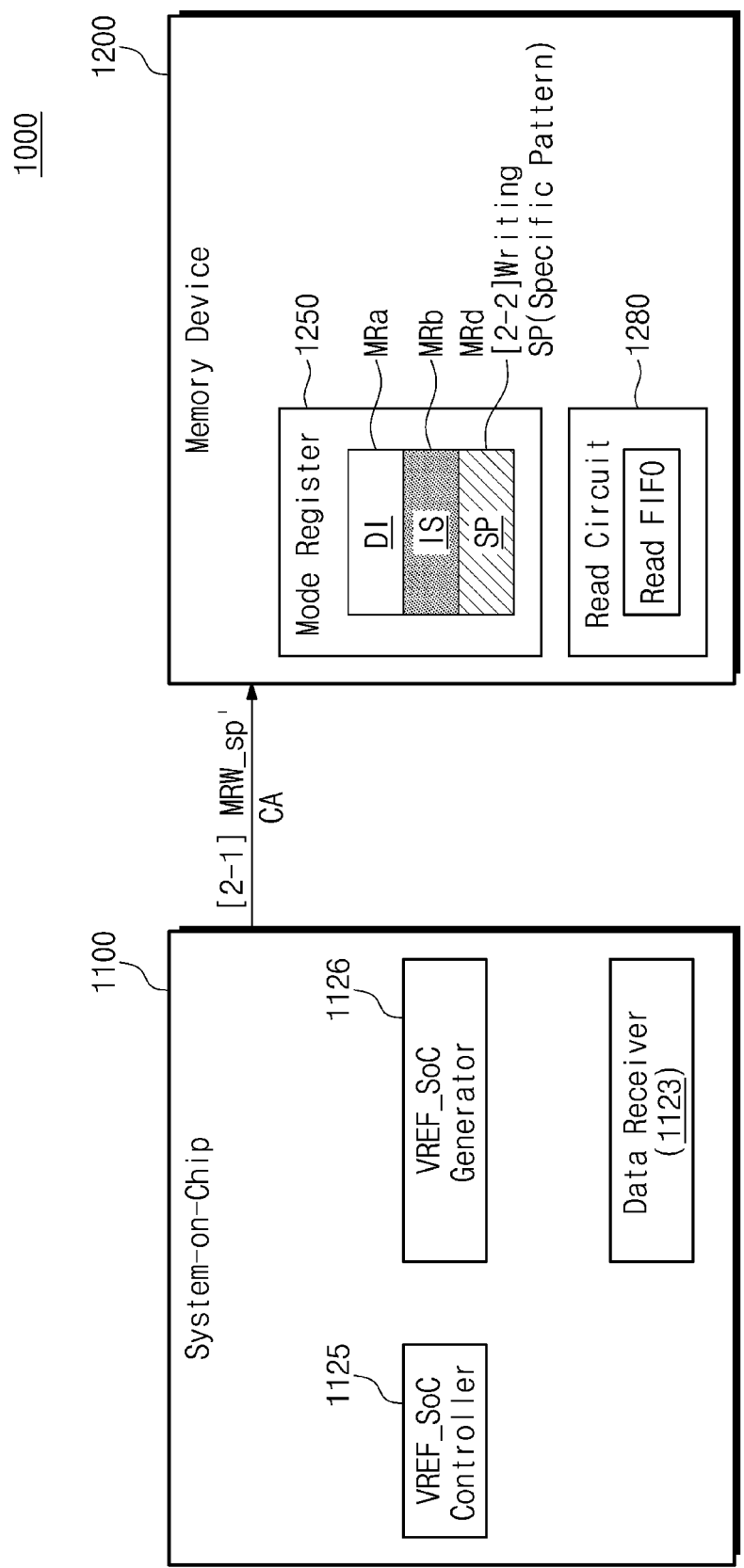
FIGS. 13A and 13B illustrate diagrams descriptive of an operation according to the flowchart of FIG. 12.
Figure 13B:
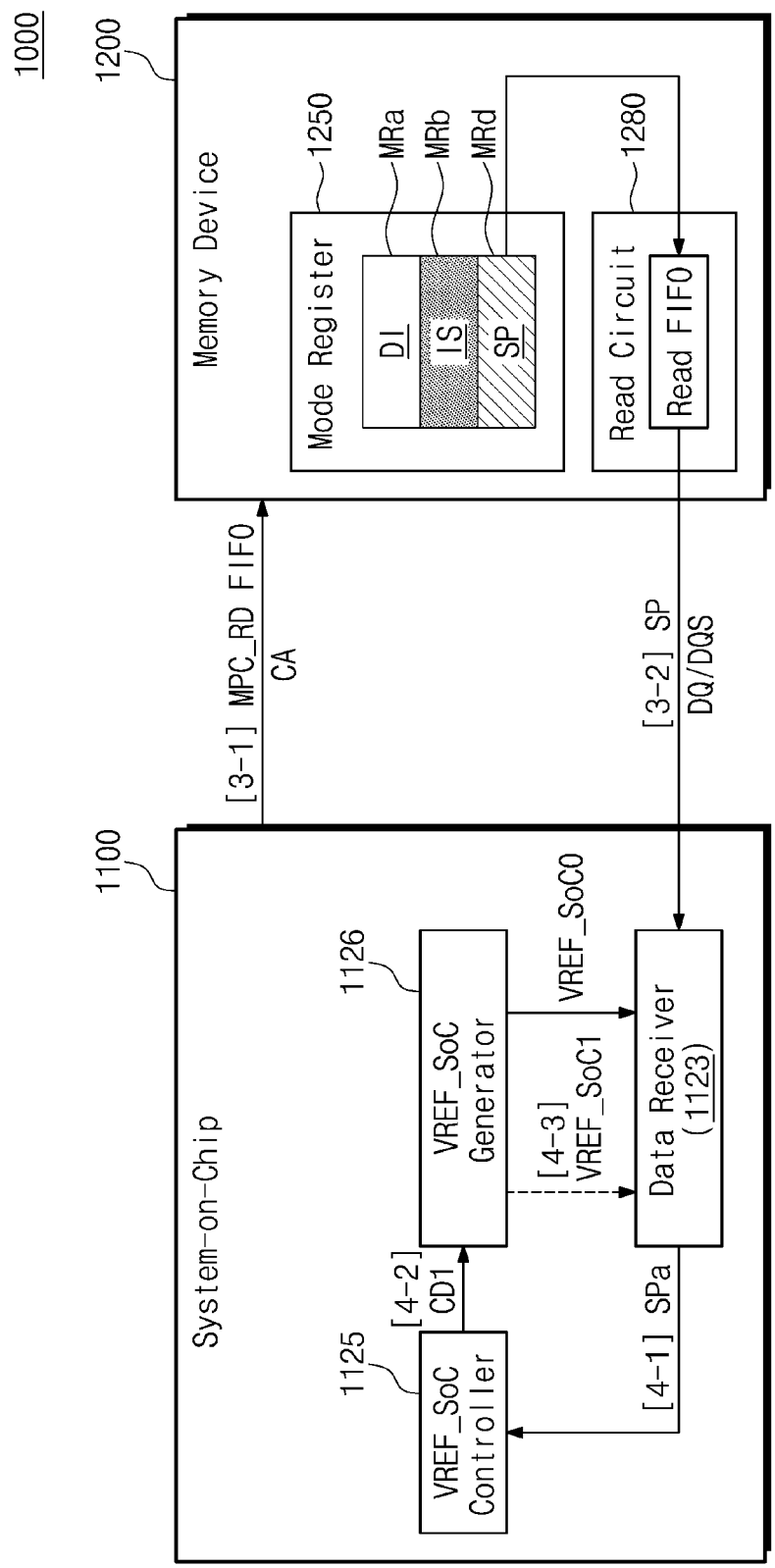

FIGS. 13A and 13B illustrate diagrams descriptive of an operation according to the flowchart of FIG. 12. For convenience of description, additional description associated with the above components will be omitted to avoid redundancy. Referring to FIGS. 12 to 13B, electronic device 1000 may include SoC 1100 and memory device 1200. SoC 1100 may include data receiver 1123, SoC reference voltage controller 1125, and SoC reference voltage generator 1126. Memory device 1200 may include mode register circuit 1250 and read circuit 1280.

In operation [2-1] of FIG. 13A, SoC 1100 transmits a specific MRW command MRW_sp' for writing the specific pattern SP in mode register circuit 1250 through the command/address signal CA. In an exemplary embodiment, the specific MRW command MRW_sp' of FIG. 13A and the specific MRW command MRW_sp of FIG. 8B may have different mode register addresses. For example, the specific MRW command MRW_sp of FIG. 8B may include a mode register address for a mode register, which supports both a read function and a write function, such as "MR12" or "MR14", and the specific MRW command MRW_sp' of FIG. 13A may include a mode register address corresponding to a specific mode register. In an exemplary embodiment, the specific mode register may indicate a mode register, which is configured to output written information in response to the multi-purpose command MPC, such as "MR32", "MR40", "MR15", or "MR20". In an exemplary embodiment, the mode registers such as "MR32", "MR40", "MR15", and "MR20" may be mode registers for storing patterns that are used in the DQ calibration.

In operation [2-2] of FIG. 13A, memory device 1200 writes the specific pattern SP in a specific mode register MRd (e.g., "MR32", "MR40", "MR15", or "MR20") in response to the specific MRW command MRW_sp'.

Next, in operation [3-1] of FIG. 13B, SoC 1100 transmits the multi-purpose command MPC to memory device 1200 through the command/address signal CA. In an exemplary embodiment, the multi-purpose command MPC may be a command for reading the specific pattern SP stored in a specific mode register (e.g., MRd). In an exemplary embodiment, the multi-purpose command MPC may be one of various multi-purpose commands such as RD, DQ Cal, MPC and RD FIFO MPC.

In operation [3-2] of FIG. 13B, memory device 1200 outputs the specific pattern SP stored in the specific mode register (e.g., MRd) in response to the multi-purpose command MPC. For example, the specific pattern SP may be output as the data signal DQ and the data strobe signal DQS through the read FIFO of read circuit 1280 in the memory device 1200.

SoC 1100 captures the signal received based on the 0-th SoC reference voltage VREF_SoC0 (in operation [4-1]), generates the code CD1 based on the captured signal (in operation [4-2]), and generates the first SoC reference voltage VREF_SoC1 based on the generated code CD1 (in operation [4-3]). The above operations are similar to those described previously, and thus additional description will be omitted to avoid redundancy.

As described above, SoC 1100 according to an exemplary embodiment of the inventive concepts may optimize the SoC reference voltage VREF_SoC by using the multi-purpose command MPC instead of the specific MRR command MRR_sp. In an exemplary embodiment, a command timing of the multi-purpose command MPC may be similar to the timing diagram of the MRR operation described with reference to FIG. 5B. That is, the multi-purpose command MPC may be transmitted by using two rising edges of the clock signal CK_t, and the second CAS command CAS-2 may be transmitted immediately after the multi-purpose command MPC is transmitted. Table 4 below shows a command truth table of the multi-purpose command MPC.

TABLE 4

|  | CS | CA0 | CA1 | CA2 | CA3 | CA4 | CA5 | CK_t |
|---|---|---|---|---|---|---|---|---|
| MPC | H | L | L | L | L | L | OP6 | R1 |
|  | L | OP0 | OP1 | OP2 | OP3 | OP4 | OP5 | R2 |
| CAS-2 | H | L | H | L | L | H | C8 | R1 |
|  | L | C2 | C3 | C4 | C5 | C6 | C7 | R2 |

As illustrated in Table 4 above, the multi-purpose command MPC and the second CAS command CAS-2 may be transmitted by controlling the chip select signal CS and the plurality of command/address signals CA0 to CA5. For example, SoC 1100 may transmit a first portion of the multi-purpose command MPC by setting the chip select signal CS to "H", setting the 0-th to fourth command/address signals CA0 to CA4 to "L", and setting a sixth operation code OP6 to the fifth command/address signal CA5, at a first rising edge R1 of the clock signal CK_t. SoC 1100 may transmit a second portion of the multi-purpose command MPC by setting the chip select signal CS to "L" and setting 0-th to fifth operation codes OP0 to OP5 to the 0-th to fifth command/address signals CA0 to CA5, respectively, at a second rising edge R2 of the clock signal CK_t. That is, SoC 1100 may transmit the multi-purpose command MPC by setting the chip select signal CS and the plurality of command/address signals CA0 to CA5 at two rising edges R1 and R2 of the clock signal CK_t like Table 4 above. The second CAS command CAS-2 is described previously, and thus additional description will be omitted to avoid redundancy.

As described above, SoC 1100 according to an exemplary embodiment of the inventive concepts may read the device information DI from memory device 1200 through the MRR operation in the initialization or training procedure. SoC 1100 may receive the data signal DQ and the data strobe signal DQS through the device information DI. In this case, when the initial SoC reference voltage VREF_SoC used at SoC 1100 is not optimized, the device information DI received through the data signal DQ and the data strobe signal DQS may not be normally (e.g., accurately) captured.

As such, before performing the MRR operation for reading device information, SoC 1100 according to an exemplary embodiment of the inventive concepts may optimize the SoC reference voltage VREF_SoC by writing a specific pattern and repeatedly reading the written specific pattern, by using various commands (e.g., MRW, MRR, and MPC). Accordingly, the device information DI may be normally (e.g., accurately) read in a next MRR operation, and thus, the reliability of operation of SoC 1100 may be improved.

Figure 14:
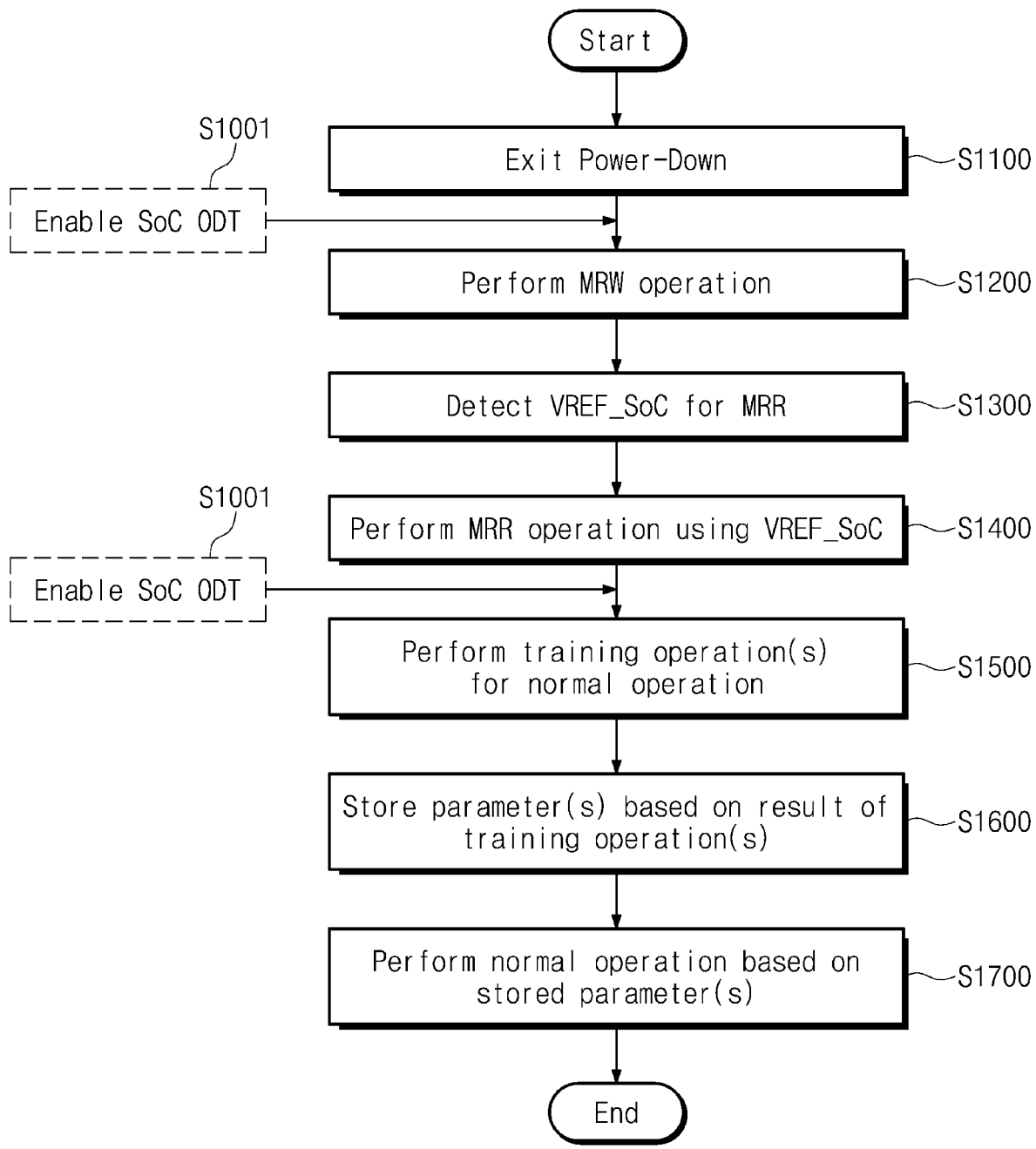
FIG. 14 illustrates a flowchart of an operation of an SoC according to an exemplary embodiment of the inventive concepts.

FIG. 14 illustrates a flowchart of an operation of an SoC according to an exemplary embodiment of the inventive concepts. For convenience of description, additional description associated with the above components will be omitted to avoid redundancy. Referring to FIGS. 1 and 14, in operation S1100, SoC 1100 exits the power-down mode.

In operation S1200, SoC 1100 performs the MRW operation. In operation S1300, SoC 1100 detects the SoC reference voltage VREF_SoC for the MRR operation. In an exemplary embodiment, operation S1300 may include an operation of optimizing the SoC reference voltage VREF_SoC described with reference to FIGS. 1 to 13B.

In operation S1400, SoC 1100 performs the MRR operations based on the detected SoC reference voltages VREF_SoC. For example, SoC 1100 may read device information from memory device 1200 by performing the MRR operation based on the detected SoC reference voltage VREF_SoC.

In operation S1500, SoC 1100 performs a plurality of training operations. For example, SoC 1100 may sequentially perform the ZQ calibration operation, the CA bus training operation, the write leveling operation, and the DQ training operation, as described with reference to FIGS. 4A and 4B.

In operation S1600, SoC 1100 stores various parameters based on training results. For example, SoC 1100 may store the various parameters, which are based on the training results, in mode register circuit 1250 of memory device 1200 or in internal circuits of SoC 1100.

In operation S1700, SoC 1100 performs a normal operation based on the stored parameters. In an exemplary embodiment, a level of the SoC reference voltage VREF_SoC detected in operation S1300 may be different from a level of the SoC reference voltage VREF_SoC used for the normal operation in operation S1700. For example, the SoC reference voltage VREF_SoC detected in operation S1300 may have a level optimized for the MRR operation in a low-speed operation. Afterwards, the SoC reference voltage VREF_SoC may be again set to have the optimized level in a high-speed operation (i.e., a normal operation) through operation S1500 (e.g., the DQ training operation).

In an exemplary embodiment, SoC 1100 may enable SoC ODT at a specific time for the purpose of securing the reliability of various signal lines (e.g., command/address lines and data lines). For example, in operation S1001, SoC 1100 may enable the SoC ODT. The SoC ODT may indicate an ODT resistor (e.g., R-ODT of FIG. 5C) connected with a data line (i.e., a line receiving the data signal DQ) connected with SoC 1100. In the case where the SoC ODT is enabled, the signal reflection of the data line may be decreased, and thus the reliability of signal may be improved. That is, SoC 1100 may improve the reliability of signals by enabling the SoC ODT at a specific time.

In this case, as illustrated in FIG. 14, operation S1001 may be performed before operation S1200. That is, SoC 1100 may enable the SoC ODT at a time when an initialization sequence starts. Alternatively, SoC 1100 may enable the SoC ODT immediately before operation S1500. For example, a result of the training operation may vary depending on whether the SoC ODT is enabled. Accordingly, SoC 1100 may enable the SoC ODT immediately before the training operation is performed, for the purpose of normally performing the training operation. The SoC ODT enable time described above is exemplary, and the inventive concepts are not limited thereto.

Figure 15:
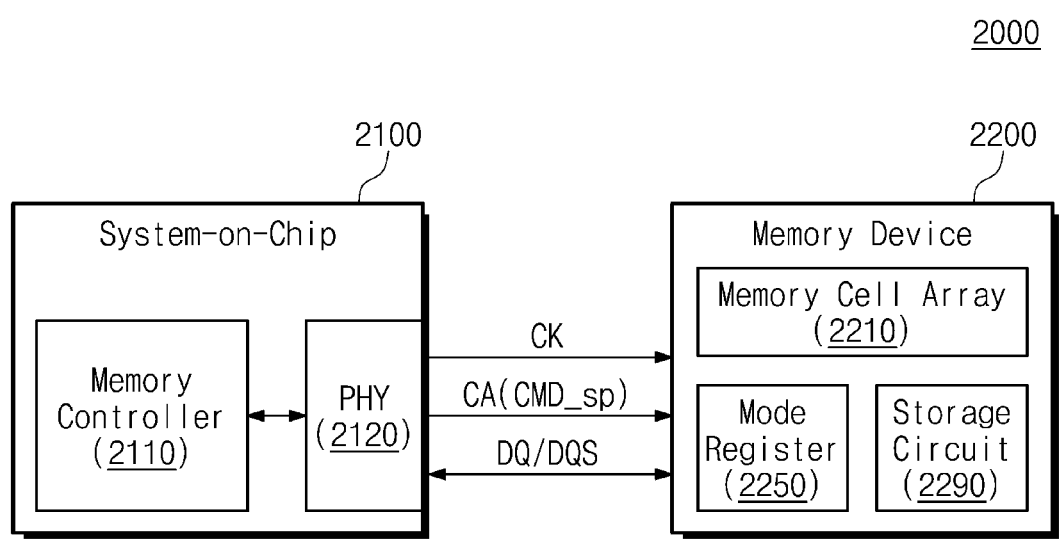
FIG. 15 illustrates a block diagram of an electronic device according to an exemplary embodiment of the inventive concepts.

FIG. 15 illustrates a block diagram of an electronic device according to an exemplary embodiment of the inventive concepts. For convenience of description, additional description associated with the components of FIG. 15 described with reference to previous embodiments will be omitted to avoid redundancy. Referring to FIG. 15, electronic device 2000 may include SoC 2100 and memory device 2200. SoC 2100 may include memory controller 2110 and PHY 2120. Memory device 2200 may include memory cell array 2210, mode register circuit 2250, and storage circuit 2290. SoC 2100, memory controller 2110, PHY 2120, memory device 2200, memory cell array 2210, and mode register circuit 2250 have been described previously, and thus additional description will be omitted to avoid redundancy.

Examples in which an SoC optimizes the SoC reference voltage VREF_SoC by writing a specific pattern in a mode register circuit of a memory device and repeatedly performing operations of reading the written specific pattern are described with reference to previous embodiments. In contrast, in the embodiment of FIG. 15, memory device 2200 may further include storage circuit 2290 that is independent of memory cell array 2210 and mode register circuit 2250. SoC 2100 may optimize the SoC reference voltage VREF_SoC by writing a specific pattern in storage circuit 2290 of memory device 2200 and repeatedly performing operations of reading the written specific pattern. The manner of operation of electronic device 2000 is similar to those of the above embodiments except that a specific pattern is stored in separate storage circuit 2290, and thus additional description will be omitted to avoid redundancy.

Figure 16:
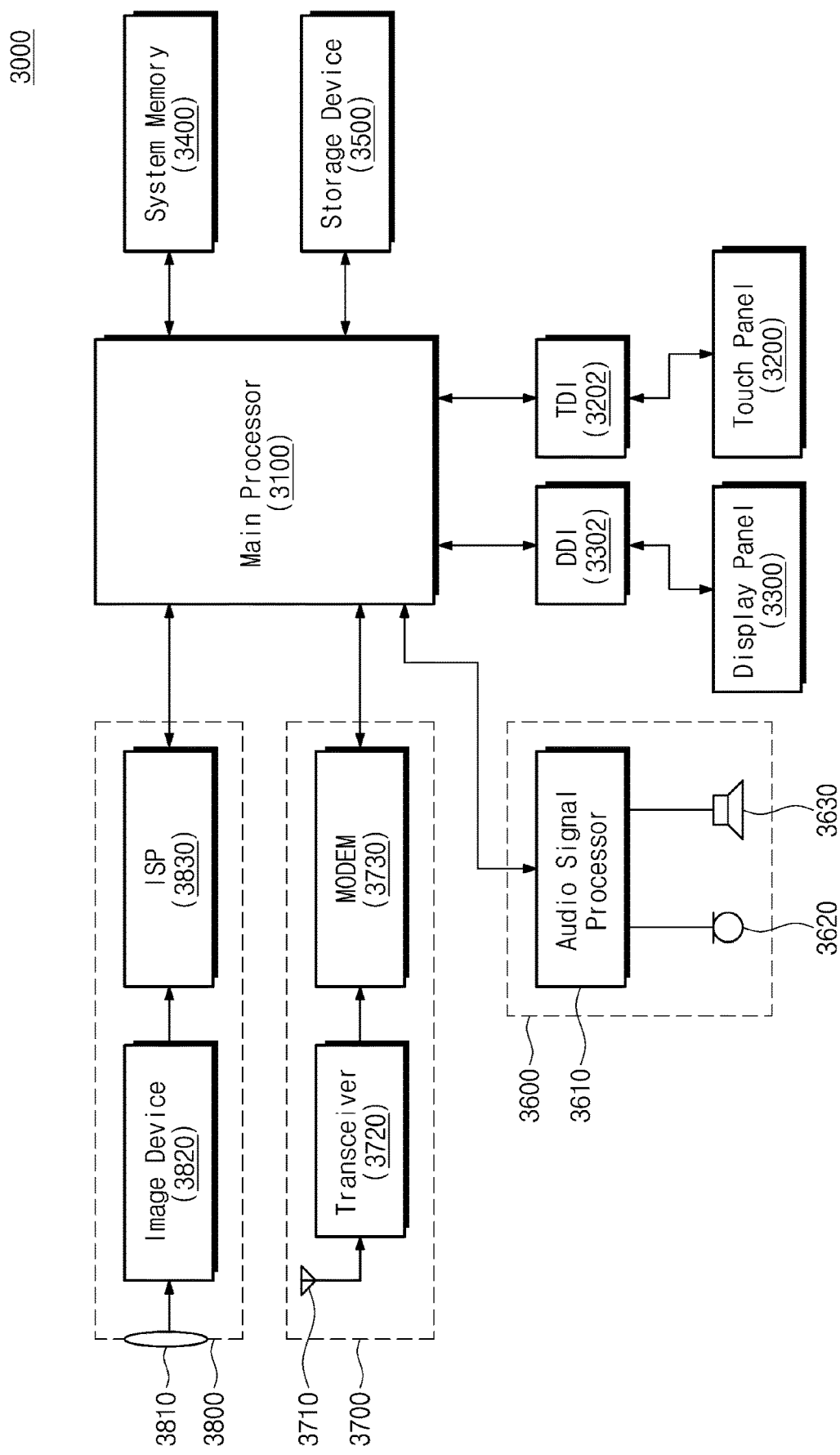
FIG. 16 illustrates a block diagram of an electronic device according to the inventive concepts.

FIG. 16 illustrates a block diagram of an electronic device according to the inventive concepts. Referring to FIG. 16, electronic device 3000 may include main processor 3100, touch panel 3200, touch driver integrated circuit 3202, display panel 3300, display driver integrated circuit 3302, system memory 3400, storage device 3500, image processor 3800, communication block 3700, and audio processor 3600. In an exemplary embodiment, electronic device 3000 may be one of various electronic devices such as for example a portable communication terminal, a personal digital assistant (PDA), a portable media player (PMP), a digital camera, a smartphone, a tablet computer, a laptop computer, a wearable device, and the like.

Main processor 3100 may control overall operations of electronic device 3000. Main processor 3100 may control/manage operations of the components of electronic device 3000. Main processor 3100 may process various operations for the purpose of operating electronic device 3000. Touch panel 3200 may be configured to sense a touch input from a user under control of touch driver integrated circuit 3202. Display panel 3300 may be configured to display image information under control of display driver integrated circuit 3302.

System memory 3400 may store data that are used for an operation of electronic device 3000. For example, system memory 3400 may include volatile memory such as SRAM, DRAM, or SDRAM, and/or nonvolatile memory such as PRAM, MRAM, ReRAM, or FRAM. In an exemplary embodiment, system memory 3400 may be a memory device such as 1200 or 2200 described previously, and main processor 3100 may be an SoC such as 1100 or 1200 described previously. Main processor 3100 may perform an initialization operation or a training operation with a system memory based on the embodiments previously described.

Storage device 3500 may store data regardless of whether power is supplied. For example, storage device 3500 may include at least one of various nonvolatile memories such as flash memory, PRAM, MRAM, ReRAM, and FRAM. For example, storage device 3500 may include an embedded memory and/or a removable memory of electronic device 3000.

Audio processor 3600 may process an audio signal by using audio signal processor 3610. Audio processor 3600 may receive an audio input through microphone 3620 or may provide an audio output through speaker 3630. Communication block 3700 may exchange signals with an external device/system through antenna 3710. Transceiver 3720 and modulator/demodulator (MODEM) 3730 of the communication block 3700 may process signals exchanged with the external device/system in compliance with at least one of various wireless communication protocols such as for example long term evolution (LTE™), worldwide interoperability for microwave access (WiMax), global system for mobile communication (GSM), code division multiple access (CDMA), Bluetooth, near field communication (NFC), wireless fidelity (Wi-Fi), and radio frequency identification (RFID), or the like. Image processor 3800 may receive light through lens 3810. Image device 3820 and image signal processor (ISP) 3830 included in image processor 3800 may generate image information about an external object, based on a received light.

According to the inventive concepts, a system-on-chip (SoC) may optimize an SoC reference voltage for capturing the data signal DQ received from a memory device, in an initialization procedure with the memory device. As such, the reliability of the initialization operation with the memory device of the system-on-chip may be improved. Accordingly, an operation method of a system-on-chip configured to control a memory device having improved reliability is provided.

While the inventive concepts have been described with reference to exemplary embodiments thereof, it should be apparent to those of ordinary skill in the art that various changes and modifications may be made thereto without departing from the spirit and scope of the inventive concepts as set forth in the following claims.

What is claimed is:

1. An operation method of a system-on-chip (SoC) configured to control a memory device, the method comprising:
   transmitting a first mode register write (MRW) command to the memory device through command/address lines;
   transmitting a second MRW command including a specific pattern to the memory device through the command/address lines;
   transmitting a first mode register read (MRR) command for reading the specific pattern to the memory device through command/address lines;
   receiving the specific pattern read from the memory device through data lines;
   capturing the specific pattern received from the memory device based on an SoC reference voltage generated by the SoC;
   adjusting the SoC reference voltage based on the captured specific pattern;
   transmitting a second MRR command to the memory device through the command/address lines;

receiving data signals corresponding to the second MRR command from the memory device through the data lines;

capturing the received data signals based on the adjusted SoC reference voltage; and performing a plurality of training operations on the memory device after the adjusting the SoC reference voltage.

2. The operation method of claim 1, wherein the second MRW command includes a first mode register address corresponding to a mode register from among a plurality of mode registers included in the memory device, the mode register configured to store information about an internal DQ reference voltage.

3. The operation method of claim 2, wherein the first MRR command includes the first mode register address.

4. The operation method of claim 1, further comprising:
after the performing the plurality of training operations is completed, performing a normal operation on the memory device based on a result of the plurality of training operations.

5. The operation method of claim 4, wherein the normal operation is performed based on a first clock, and
wherein the transmitting the second MRR command is performed based on a second clock having a lower frequency than the first clock.

6. The operation method of claim 1, wherein the received data signals captured based on the adjusted SoC reference voltage include device information about the memory device.

7. The operation method of claim 1, wherein the transmitting the first MRW command is performed after a given time elapses after a time at which a power-down mode is released.

8. The operation method of claim 1, wherein the plurality of training operations include a ZQ calibration operation, a command/address bus training operation, a write leveling operation, and a DQ training operation for the memory device.

9. The operation method of claim 8, wherein the DQ training operation comprises re-adjusting the adjusted SoC reference voltage.

10. The operation method of claim 1, further comprising enabling SoC on-die termination (ODT) for the command/address lines and the data lines before the transmitting the first MRW command to the memory device.

11. An operation method of a system-on-chip (SoC) configured to control a memory device, the method comprising:
writing an initial setting value in a mode register circuit of the memory device through command/address lines;
adjusting an SoC reference voltage, generated by the SoC, based on information received from the memory device through data lines;
capturing device information of the memory device received from the memory device through the data lines based on the adjusted SoC reference voltage; and
performing a plurality of training operations on the memory device after the adjusting the SoC reference voltage.

12. The operation method of claim 11, wherein the writing the initial setting value comprises transmitting a first mode register write (MRW) command including a first mode register address corresponding to a mode register from among a plurality of mode registers of the mode register circuit in which the initial setting value is to be stored, and the initial setting value, through the command/address lines, and
wherein the capturing the device information comprises transmitting a first mode register read (MRR) command including a second mode register address corresponding to a mode register from among the plurality of mode registers in which the device information is stored, and
receiving the device information from the memory device through the data lines responsive to the transmitted first MRR command.

13. The operation method of claim 12, wherein the adjusting the SoC reference voltage comprises:
transmitting a second MRW command including a third mode register address and a specific pattern to the memory device through the command/address lines;
transmitting a second MRR command including the third mode register address to the memory device through the command/address lines;
receiving the specific pattern from the memory device through the data lines responsive to the transmitted second MRR command;
comparing the received specific pattern and the transmitted specific pattern; and
adjusting the SoC reference voltage based on a result of the comparing,
wherein the third mode register address corresponds to a mode register, from among the plurality of mode registers, that supports both a read function and a write function.

14. The operation method of claim 12, wherein the adjusting the SoC reference voltage comprises:
transmitting a second MRW command including the first mode register address to the memory device through the command/address lines;
receiving the initial setting value from the memory device through the data lines responsive to the transmitted second MRR command;
comparing the received initial setting value and the transmitted initial setting value; and
adjusting the SoC reference voltage based on a result of the comparing, wherein the first mode register address corresponds to a mode register, from among the plurality of mode registers, that supports both a read function and a write function.

15. The operation method of claim 12, wherein the adjusting the SoC reference voltage comprises:
transmitting a second MRW command including a third mode register address and a specific pattern to the memory device through the command/address lines;
transmitting a multi-purpose command (MPC) through the command/address lines;
receiving the specific pattern from the memory device through the data lines responsive to the MPC;
comparing the received specific pattern and the transmitted specific pattern; and
adjusting the SoC reference voltage based on a result of the comparing,
wherein the third mode register address corresponds to a mode register, from among the plurality of mode registers, in which a DQ calibration pattern is written.

16. The operation method of claim 11, wherein the plurality of training operations include a ZQ calibration operation, a command/address bus training operation, a write leveling operation, and a DQ training operation for the memory device.

17. The operation method of claim 16, wherein the DQ training operation comprises re-adjusting the adjusted SoC reference voltage.

18. An operation method of a system-on-chip (SoC) configured to control a memory device, the method comprising:
- performing a first mode register write operation and a first mode register read operation on a mode register circuit included in the memory device;
- adjusting an SoC reference voltage, generated by the SoC, based on a result of the first mode register read operation;
- performing a second mode register read operation on the mode register circuit based on the adjusted SoC reference voltage; and
- performing a plurality of training operations on the memory device after the adjusting the SoC reference voltage.

19. The operation method of claim 18, wherein the first mode register write operation and the first mode register read operation are performed on a first mode register from a plurality of mode registers included in the mode register circuit.

20. The operation method of claim 18, wherein the performing the first mode register write operation and the first mode register read operation includes repeatedly performing a plurality of first mode register read operations using different SoC reference voltages, and
- wherein the adjusting the SoC reference voltage includes performing a scanning operation on the SoC reference voltages based on results of the plurality of first mode register read operations.

\* \* \* \* \*